(12) United States Patent
Mitani et al.

(10) Patent No.: US 8,264,865 B2
(45) Date of Patent: Sep. 11, 2012

(54) NONVOLATILE MEMORY ELEMENT, MANUFACTURING METHOD THEREOF, AND NONVOLATILE SEMICONDUCTOR DEVICE INCORPORATING NONVOLATILE MEMORY ELEMENT

(75) Inventors: Satoru Mitani, Osaka (JP); Yoshihiko Kanzawa, Osaka (JP); Koji Katayama, Nara (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 12/677,404

(22) PCT Filed: Jul. 1, 2009

(86) PCT No.: PCT/JP2009/003055
§ 371 (c)(1),
(2), (4) Date: Mar. 10, 2010

(87) PCT Pub. No.: WO2010/004705
PCT Pub. Date: Jan. 14, 2010

(65) Prior Publication Data
US 2011/0002154 A1  Jan. 6, 2011

(30) Foreign Application Priority Data
Jul. 11, 2008  (JP) .................. 2008-180946

(51) Int. Cl.
*G11C 11/00* (2006.01)
(52) U.S. Cl. .......... 365/148; 365/100; 365/173; 365/46; 365/158
(58) Field of Classification Search ................. 365/148, 365/100, 173, 46, 158
See application file for complete search history.

(56) References Cited

U.S. PATENT DOCUMENTS

| 5,994,757 | A | 11/1999 | Ichikawa et al. |
| 6,473,332 | B1 | 10/2002 | Ignatiev et al. |
| 2004/0235247 | A1 | 11/2004 | Hsu et al. |
| 2004/0245557 | A1 | 12/2004 | Seo et al. |
| 2005/0174835 | A1 | 8/2005 | Rinerson et al. |
| 2005/0207265 | A1 | 9/2005 | Hsu et al. |
| 2005/0247921 | A1 | 11/2005 | Lee et al. |

(Continued)

FOREIGN PATENT DOCUMENTS
JP    07-263647    10/1995
(Continued)

OTHER PUBLICATIONS

I.G. Baek., et al., "Highly Scalable Non-volatile Resistive Memory using Simple Binary Oxide Driven by Asymmetric Unipolar Voltage Pulese", Tech Digest IEDM, 2004, p. 587, IEEE.

(Continued)

*Primary Examiner* — Thong Q Le
(74) *Attorney, Agent, or Firm* — McDermott Will & Emery LLP

(57) ABSTRACT

A nonvolatile memory element of the present invention comprises a first electrode (103), a second electrode (108); a resistance variable layer (107) which is interposed between the first electrode (103) and the second electrode (107) and is configured to switch a resistance value reversibly in response to an electric signal applied between the electrodes (103) and (108), and the resistance variable layer (107) has at least a multi-layer structure in which a first hafnium-containing layer having a composition expressed as $HfO_x$ ($0.9 \leq x \leq 1.6$), and a second hafnium-containing layer having a composition expressed as $HfO_y$ ($1.8 < y < 2.0$) are stacked together.

25 Claims, 22 Drawing Sheets

U.S. PATENT DOCUMENTS

| | | | |
|---|---|---|---|
| 2006/0081962 A1* | 4/2006 | Wei et al. | 257/537 |
| 2006/0215445 A1 | 9/2006 | Baek et al. | |
| 2007/0240995 A1 | 10/2007 | Odagawa et al. | |
| 2007/0246832 A1 | 10/2007 | Odagawa et al. | |
| 2008/0007988 A1 | 1/2008 | Ahn et al. | |
| 2008/0083918 A1 | 4/2008 | Aratani et al. | |
| 2009/0097300 A1 | 4/2009 | Ishihara et al. | |
| 2009/0224224 A1 | 9/2009 | Fujii et al. | |

FOREIGN PATENT DOCUMENTS

| | | |
|---|---|---|
| JP | 2004-349689 | 12/2004 |
| JP | 2004-363604 | 12/2004 |
| JP | 2005-317976 | 11/2005 |
| JP | 2006-040946 | 2/2006 |
| JP | 2006-279042 | 10/2006 |
| JP | 2007-180202 | 7/2007 |
| JP | 2007-287761 | 11/2007 |
| JP | 2007-288008 | 11/2007 |
| JP | 2008/022007 | 1/2008 |
| JP | 2008-512857 | 4/2008 |
| WO | WO 2006/075574 A1 | 7/2006 |
| WO | WO 2008/059701 A1 | 5/2008 |

OTHER PUBLICATIONS

Masayuki Fujimoto., et al., "High-Speed Resistive Switching of $TiO_2$/TiN Nano-Crystalline Thin Film" Japanese Journal of Applied Physics, 2006, vol. 45 No. 11, pp. L310-L312, The Japan Society of Applied Physics.

\* cited by examiner (a)

(b)

(c)

(a)

(b)

(c)

NONVOLATILE MEMORY ELEMENT, MANUFACTURING METHOD THEREOF, AND NONVOLATILE SEMICONDUCTOR DEVICE INCORPORATING NONVOLATILE MEMORY ELEMENT

RELATED APPLICATIONS

This application is the U.S. National Phase under 35 U.S.C. §371 of International Application No. PCT/JP2009/003055, filed on Jul. 1, 2009, which in turn claims the benefit of Japanese Application No. 2008-180946, filed on Jul. 11, 2008, the disclosures of which Applications are incorporated by reference herein.

TECHNICAL FIELD

The present invention relates to a nonvolatile memory element. Particularly, the present invention relates to a resistance variable nonvolatile memory element which switches between resistance values upon application of electric signals thereto, a manufacturing method thereof, and a nonvolatile semiconductor device incorporating the nonvolatile memory element.

BACKGROUND ART

With recent advancement of digital technologies, electronic hardware such as portable information devices and home information appliances have been developed to provide higher functionality. For this reason, there have been demands for an increase in a capacity of a nonvolatile memory device, reduction in a write electric power in the memory device, reduction in write and read time in the memory device, and longer life of the memory device.

Under the circumstances in which there are such demands, it is said that there is a limitation on miniaturization of the existing flash memory using a floating gate. Accordingly, in recent years, a novel resistance variable nonvolatile memory element using a resistance variable layer as a material of a memory section has attracted an attention.

As shown in FIG. 24, the resistance variable nonvolatile memory element basically has a very simple structure in which a resistance variable layer 504 is sandwiched between a lower electrode 503 and an upper electrode 505. Upon application of predetermined electric pulses between the upper and lower electrodes, the nonvolatile memory element switches to a high-resistance state or to a low-resistance state. By corresponding these different resistance states to numeric values, respectively, data is stored. Because of such a simple structure and operation, further miniaturization and cost reduction of the resistance variable nonvolatile memory device are expected. Since switching to the high-resistance state or to the low-resistance state occurs in an order of 100 nsec or less in some cases, the resistance variable nonvolatile memory element has attracted an attention because of a potential of a high-speed operation, and a variety of proposals therefor have been made.

For example, Patent document 1 discloses a resistance variable nonvolatile memory element in which metal ions are caused to travel into and out of a resistance variable layer 504 to attain a high-resistance state and a low-resistance state by applying voltages between an upper electrode and a lower electrode, thereby storing data. Also, as disclosed in Patent document 2, there is known a resistance variable memory in which crystalline and non-crystalline states of a resistance variable layer are changed using electric pulses to switch its resistance states (phase change memory).

In addition to the above, there are many proposals for resistance variable nonvolatile memory elements using metal oxides for the resistance variable layer 504. It is considered that these nonvolatile memory elements are operable with a mechanism different from aforesaid mechanisms. It is said that oxygen in the metal oxide layer used as the resistance variable layer migrates in response to electric pulses, causing resistance switching (detail of the mechanism is not made clear yet).

The resistance variable nonvolatile memory elements using such metal oxides are classified into two major kinds depending on the material used for the resistance variable layer. Patent document 3 or the like discloses one kind of resistance variable nonvolatile memory element using perovskite materials ($Pr_{(1-x)}Ca_xMnO_3$ (PCMO), $LaSrMnO_3$ (LSMO), $GdBaCo_xO_y$ (GBCO), as the resistance variable layer.

The other kind is resistance variable nonvolatile memory elements using binary transition metal oxides. Since the binary transition metal oxides have a very simple composition and structure as compared to aforesaid perovskite materials, composition control and layer deposition in manufacturing are relatively easy. In addition, the binary transition metal oxides have an advantage that they are relatively highly compatible with a semiconductor manufacturing process. For these reasons, the binary transition metal oxides have been vigorously studied recently. For example, Patent document 4 or Non-patent document 1 discloses NiO, $V_2O_5$, ZnO, $Nb_2O_5$, $TiO_2$, $WO_3$, and CoO as the resistance switching material. Patent document 5 discloses resistance variable nonvolatile memory elements using as the resistance switching materials, sub-oxides (oxides having a composition outside a range of a stoichiometric composition) of Ni, Ti, Hf, Nb, Zn W, Co, etc. Furthermore, Patent document 6 or Non-patent document 2 discloses an example, in which a structure formed by oxidating a surface of TiN to form a crystalline $TiO_2$ film of a nanometric order is used as the resistance variable layer.

In addition to the above, Patent document 7 discloses so-called a one time programmable memory which uses titanium oxide and tantalum oxide ($Ta_2O_5$) as the resistance switching material and is capable of writing only once.

Prior Art Document

Patent Document

Patent document 1: Japanese Laid-Open Patent Application Publication No. 2006-40946

Patent document 2: Japanese Laid-Open Patent Application Publication No. 2004-349689

Patent document 3: U.S. Pat. No. 6,473,332 Specification

Patent document 4: Japanese Laid-Open Patent Application Publication No. 2004-363604

Patent document 5: Japanese Laid-Open Patent Application Publication No. 2005-317976

Patent document 6: Japanese Laid-Open Patent Application Publication No. 2007-180202

Patent document 7: Japanese Laid-Open Patent Application Publication No. Hei. 7-263647

Non-Patent Documents

Non-patent document 1: I. G. Beak et al., Tech. Digest IEDM 2004, page 587

Non-patent document 2: Japanese Journal of Applied Physics Vol 45, NO 11, 2006, L310-L312

SUMMARY OF THE INVENTION

Problems to be Solved by the Invention

However, the transition metal oxides used as the above mentioned conventional resistance switching material have drawbacks as described below.

In the conventional resistance variable nonvolatile memory element using the transition metal oxide such as NiO, switching of the resistance switching material from the high-resistance state to the low-resistance state is accomplished using a short electric pulse of about 100 nsec as disclosed in Non-patent document 1. However, to switch the resistance switching material from the low-resistance state to the high-resistance state, a longer pulse of μsec order is required. This arises a problem that achievement of a high-speed operation is difficult.

The resistance variable memory having a structure ($TiO_2$/TiN structure) formed by oxidating the surface of TiN to form microcrystalline $TiO_2$, which is disclosed in Patent document 6 or Non-patent document 2, can dispense with "forming" process. In this memory, $TiO_2$ is composed of an aggregate of microcrystals (hereinafter referred to as nanocrystals) of a nanometric order. It is said that the resistance state switches according to the size of the nanocrystals. In general, the size or structure of the nanocrystals is very sensitive to a manufacturing process (formation by oxidation in the above case), and there may be significant variations in nanocrystals in manufacture. Therefore, the nanocrystals are likely to bring about a variation in the state of resistance switching if used as the resistance variable layer, which is undesirable.

In the case where the resistance variable layer is mainly composed of transition metal oxide made of $Ta_2O_5$, which is disclosed in Patent document 7, the resistance variable layer operates as an anti-fuse which is used only for one operation for switching from the high-resistance state to the low-resistance state, and rewrite cannot be performed. In this case, the resistance state of the resistance variable layer is switched by insulation breakdown of the transition metal oxide. Therefore, once the resistance variable layer switches to the low-resistance state, it will not switch back to the high-resistance state.

The present invention has been made in view of the above described circumstances, and an object of the present invention is to provide a nonvolatile memory element having a rewrite characteristic which is high-speed, reversible and stable, a manufacturing method of the nonvolatile memory element which is highly compatible with a semiconductor manufacturing process, and a nonvolatile semiconductor device incorporating the nonvolatile memory element.

Means for Solving the Problem

A nonvolatile memory element of the present invention comprises a first electrode; a second electrode; and a resistance variable layer which is interposed between the first electrode and the second electrode and is configured to switch a resistance value reversibly in response to electric signals applied between the electrodes; the nonvolatile memory element being configured to reversibly switch a resistance value between the first electrode and the second electrode in response to electric signals of different polarities which are applied between the first electrode and the second electrode; wherein the resistance variable layer has at least a multi-layer structure in which a first oxygen-deficient hafnium oxide layer being electrically conductive and having a composition expressed as $HfO_x$ ($0.9 \leq x \leq 1.6$), and a second oxygen-deficient hafnium oxide layer being electrically conductive and having a composition expressed as $HfO_y$ ($1.8 < y < 2.0$) are stacked together.

In the preferable embodiment, the second oxygen-deficient hafnium oxide layer has a thickness which is not less than 3 nm and not more than 4 nm.

In the preferable embodiment, the second oxygen-deficient hafnium oxide layer is in contact with at least one of the first electrode and the second electrode.

In the preferable embodiment, when a resistance value between the first electrode and the second electrode which occurs by applying a positive electric pulse with a magnitude of $V_H$ to an electrode with which the second oxygen-deficient hafnium oxide layer is in contact is expressed as $R_H$, and a resistance value between the first electrode and the second electrode which occurs by applying a negative electric pulse with a magnitude of $V_L$ to the electrode with which the second oxygen-deficient hafnium oxide layer is in contact is expressed as $R_L$, $|V_H|>|V_L|$, and $R_H>R_L$ are satisfied.

In the preferable embodiment, the resistance variable layer has a multi-layer structure in which a first oxygen-deficient hafnium oxide layer being electrically conductive and having a composition expressed as $HfO_x$ ($0.9 \leq x \leq 1.3$), and a second oxygen-deficient hafnium oxide layer being electrically conductive and having a composition expressed as $HfO_y$ ($1.8 < y < 2.0$) are stacked together.

In the preferable embodiment, the resistance variable layer has a multi-layer structure in which a first oxygen-deficient hafnium oxide layer being electrically conductive and having a composition expressed as $HfO_x$ ($x=0.9$), and a second oxygen-deficient hafnium oxide layer being electrically conductive and having a composition expressed as $HfO_y$ ($1.8 < y < 2.0$) are stacked together.

A nonvolatile semiconductor device of the present invention comprises a semiconductor substrate; and a memory array including plural first electrode wires provided on the semiconductor substrate so as to extend in parallel with each other, plural second electrode wires provided above the plural first electrode wires so as to extend in parallel with each other within a plane parallel to a main surface of the semiconductor substrate and so as to three-dimensionally cross the plural first electrode wires, respectively, and nonvolatile memory elements which are arranged at three-dimensional cross points of the plural first electrode wires and the plural second electrode wires; wherein when each of the first electrode wires is a first electrode and each of the second electrode wires is a second electrode, each of the nonvolatile memory elements includes a resistance variable layer which is interposed between the first electrode and the second electrode and is configured to switch a resistance value reversibly in response to voltages which are applied between the first electrode and the second electrode; and wherein the resistance variable layer has a multi-layer structure in which a first hafnium oxide layer having a composition expressed as $HfO_x$ ($0.9 \leq x \leq 1.6$), and a second hafnium oxide layer having a composition expressed as $HfO_y$ ($1.8 < y < 2.0$) are stacked together.

A nonvolatile semiconductor device of the present invention comprises a semiconductor substrate; and a memory array including plural first electrode wires provided on the semiconductor substrate so as to extend in parallel with each other, plural second electrode wires provided above the plural first electrode wires so as to extend in parallel with each other within a plane parallel to a main surface of the semiconductor substrate and so as to three-dimensionally cross the plural first electrode wires, respectively, and nonvolatile memory elements which are arranged so as to respectively correspond to three-dimensional cross points of the plural first electrode wires and the plural second electrode wires; wherein each of the nonvolatile memory elements includes a first electrode connected to associated one of the first electrode wires; a second electrode connected to associated one of the second electrode wires; and a resistance variable layer which is interposed between the first electrode and the second electrode and is configured to switch a resistance value reversibly in response to electric signals of different polarities which are applied between the first electrode and the second electrode; and wherein the resistance variable layer has a multi-layer structure in which a first hafnium oxide layer having a composition expressed as $HfO_x$ ($0.9 \leq x \leq 1.6$), and a second hafnium oxide layer having a composition expressed as $HfO_y$, ($1.8 < y < 2.0$) are stacked together.

In the preferable embodiment, the second hafnium-containing layer has a thickness which is not less than 3 nm and not more than 4 nm.

In the preferable embodiment, each of the nonvolatile memory elements includes a current rectifying element provided between the first electrode and the second electrode; and wherein the current rectifying element is electrically connected to the resistance variable layer.

In the preferable embodiment, a nonvolatile semiconductor device comprises a multi-layer memory array in which plural layers of the memory array included in the aforesaid nonvolatile semiconductor device are stacked together.

A nonvolatile memory device of the present invention comprises a semiconductor substrate; plural word lines and plural bit lines which are provided on the semiconductor substrate and are arranged so as to respectively cross each other; plural transistors which are provided so as to respectively correspond to cross points of the plural word lines and the plural bit lines; and plural nonvolatile memory elements which are provided so as to respectively correspond to the plural transistors; wherein each of the nonvolatile memory elements includes a first electrode; a second electrode; and a resistance variable layer which is interposed between the first electrode and the second electrode and is configured to switch a resistance value reversibly in response to electric signals which are applied between the first electrode and the second electrode via associated one of the transistors; and wherein the resistance variable layer has at least a multi-layer structure in which a first hafnium oxide layer having a composition expressed as $HfO_x$ ($0.9 \leq x \leq 1.6$), and a second hafnium oxide layer having a composition expressed as $HfO_y$, ($1.8 < y < 2.0$) are stacked together.

In the preferable embodiment, the second hafnium oxide layer has a thickness which is not less than 3 nm and not more than 4 nm.

A nonvolatile memory device of the present invention comprises a semiconductor substrate; a logic circuit which is provided on the semiconductor substrate and is configured to perform predetermined calculation; and a nonvolatile memory element which is provided on the semiconductor substrate; wherein the nonvolatile memory element has a programming function.

A nonvolatile memory device of the present invention comprises a logic circuit which is provided on the semiconductor substrate and is configured to perform predetermined calculation; wherein the nonvolatile memory element has a programming function.

In the preferable embodiment, the second hafnium oxide layer has a thickness which is not less than 3 nm and not more than 4 nm.

A method of manufacturing a nonvolatile memory element, of the present invention, including a first electrode; a second electrode; and a resistance variable layer which is interposed between the first electrode and the second electrode and is configured to switch a resistance value reversibly in response to electric signals which are applied between the first electrode and the second electrode; wherein the resistance variable layer has at least a multi-layer structure in which a first hafnium oxide layer having a composition expressed as $HfO_x$ ($0.9 \leq x \leq 1.6$), and a second hafnium oxide layer having a composition expressed as $HfO_y$, ($1.8 < y < 2.0$) are stacked together, the method comprising: forming the first hafnium oxide layer by a sputtering process or a chemical vapor deposition process.

In the preferable embodiment, the method comprises forming the second hafnium oxide layer by a sputtering process or a chemical vapor deposition process.

In the preferable embodiment, the method comprises forming the second hafnium oxide layer by partially oxidating the first hafnium oxide layer.

In the preferable embodiment, the second hafnium oxide layer is formed to have a thickness which is not less than about 3 nm and not more than about 4 nm.

The above and further objects, features and advantages of the present invention will more fully be apparent from the following detailed description with reference to the accompanying drawings.

Effects of the Invention

In accordance with the present invention, a nonvolatile memory element having a reversible and stable rewrite characteristic, a manufacturing method of the nonvolatile memory element which is compatible with a semiconductor manufacturing process, and a nonvolatile semiconductor device incorporating the nonvolatile memory element.

BRIEF DESCRIPTION OF THE DRAWINGS

FIG. 1 is a cross-sectional view showing an example of a configuration of a nonvolatile memory element according to Embodiment 1 of the present invention.

FIG. 2 is a view showing Rutherford backscattering spectroscopy (RBS) analysis result of a composition of a hafnium oxide layer deposited.

FIG. 3 is a view showing the relationship between the resistance value of the nonvolatile memory element and the number of electric pulse applications according to Embodiment of the present invention.

FIG. 4 is a schematic view of a cross-section of an element F.

FIG. 5 is a view showing the relationship between the resistance value of the nonvolatile memory element according to Embodiment 1 of the present invention and the number of electric pulse applications.

FIG. 6 is a view showing the relationship between the resistance value of the nonvolatile memory element according to Embodiment 1 of the present invention and the number of electric pulse applications.

FIG. 7 is a view showing spectrum of an X-ray reflectivity of a resistance variable layer comprising a hafnium oxide according to Embodiment 1 of the present invention.

FIG. 8 is a view showing the relationship between an $O_2$ flow ratio and a resistivity.

FIG. 9 is cross-sectional views showing configurations of modifications of the nonvolatile memory element according to Embodiment 1 of the present invention.

FIG. 10 is cross-sectional views showing other configurations of the modifications of the nonvolatile memory element according to Embodiment 1 of the present invention.

FIG. 11 is a block diagram showing a configuration of a nonvolatile semiconductor device according to Embodiment 2 of the present invention.

FIG. 12 is a perspective view showing a configuration(configuration of 4 bits) in part A in FIG. 11.

FIG. 13 is a cross-sectional view showing a configuration of B part in FIG. 12, and a configuration of a nonvolatile memory element included in a nonvolatile semiconductor device according to Embodiment 2 of the present invention.

FIG. 14 is a cross-sectional view showing a configuration of a modification of the nonvolatile memory element included in the nonvolatile semiconductor device according to Embodiment 2 of the present invention.

FIG. 15 is a perspective view showing a configuration of a memory array included in a nonvolatile semiconductor device of a multi-layer structure of the present invention.

FIG. 16 is a timing chart showing an example of the operation of the nonvolatile semiconductor device according to Embodiment 2 of the present invention.

FIG. 17 is a block diagram showing a configuration of a nonvolatile semiconductor device according to Embodiment 3 of the present invention.

FIG. 18 is a cross-sectional view showing a configuration (configuration of 2 bits) in part C in FIG. 17.

FIG. 19 is a timing chart showing an example of the operation of the nonvolatile semiconductor device according to Embodiment 3 of the present invention.

FIG. 20 is a block diagram showing a configuration of a nonvolatile semiconductor device according to Embodiment 4 of the present invention.

FIG. 21 is a block diagram showing a configuration of a relief address storage register included in a nonvolatile semiconductor device according to Embodiment 4 of the present invention.

FIG. 22 is a cross-sectional view showing a configuration of the relief address storage register included in the nonvolatile semiconductor device according to Embodiment 4 of the present invention.

FIG. 23 is a flowchart showing a main flow of a manufacturing process of the nonvolatile semiconductor device according to Embodiment 4 of the present invention.

FIG. 24 is a cross-sectional view showing a configuration of a conventional memory element.

EMBODIMENTS FOR CARRYING OUT THE INVENTION

Figure 1:
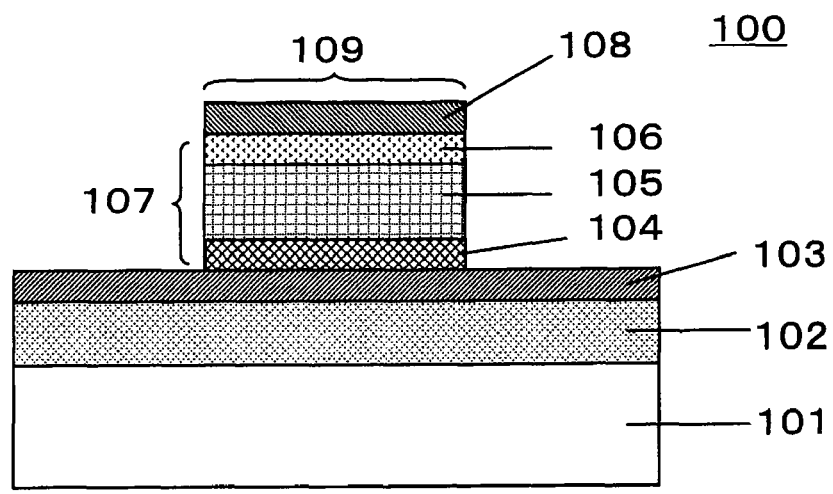
[FIG. 1]

Hereinafter, embodiments of the present invention will be described with reference to the drawings. Throughout the drawings, the same or corresponding constituents are designated by the same reference numerals and description thereof will be omitted in some cases.

(Embodiment 1)
[Configuration of Nonvolatile Memory Element]
FIG. 1 is a cross-sectional view showing an example of a configuration of a nonvolatile memory element according to Embodiment 1 of the present invention.

As shown in FIG. 1, a nonvolatile memory element 100 of this embodiment includes a substrate 101, an oxide layer 102 provided on the substrate 101, a first electrode layer 103 provided on the oxide layer 102, a second electrode layer 108, and a resistance variable layer 107 sandwiched between the first electrode layer 103 and the second electrode layer 108. The resistance variable layer 107 consists of a second hafnium-containing layer (hereinafter referred to as "second hafnium oxide layer") 105 which is low in oxygen content, a first hafnium-containing layer (hereinafter referred to as a "first hafnium oxide layer") 104 which is provided underlying the second hafnium oxide layer 105 and contains a higher oxygen content than the second hafnium oxide, and a third hafnium-containing layer (hereinafter referred to as a "third hafnium oxide layer") 106 which is provided overlying the second hafnium oxide layer 105 and contains a higher oxygen content than the second hafnium oxide.

To drive the nonvolatile memory element 100, voltages with predetermined conditions are applied from an external electric power supply between the first electrode layer 103 and the second electrode layer 108. According to the direction in which the voltages are applied, the resistance value of the resistance variable layer 107 of the nonvolatile memory element 100 increases or decreases in a reversible manner. For example, when a pulse voltage which is higher than a specified threshold voltage is applied, the resistance value of the resistance variable layer 107 increases or decreases, while when a pulse voltage which is lower than the threshold voltage is applied, the resistance value of the resistance variable layer 107 does not switch.

As the materials of the first electrode layer 103 and the second electrode layer 108, for example, there are Pt (platinum), Ir (iridium), Pd (palladium), Ag (silver), Ni (nickel), W (tungsten), Cu (copper), Al (aluminum), Ta (tantalum), Ti (titanium), TiN (titanium nitride), TaN (tantalum nitride), TiAlN (titanium aluminum nitride), etc.

The substrate 101 may be but is not limited to a silicon single crystal substrate or a semiconductor substrate. Since the resistance variable layer 107 can be formed at a relatively low substrate temperature, it can be formed on a resin material or the like.

[Manufacturing Method of Nonvolatile Memory Element]
Subsequently, the manufacturing method of the nonvolatile memory element 100 of this embodiment will be described with reference to FIG. 1.

As shown in FIG. 1, initially, over a substrate 101 which is made of single crystal silicon, a 200 nm-thick oxide layer 102 is formed by a thermal oxidation process, and a 100 nm-thick Pt thin layer is deposited over the oxide layer 102 as the first electrode layer 103 by a sputtering process. Then, using a Hf as a target, the second hafnium oxide layer 105 is deposited over the first electrode layer 103 by a reactive sputtering process in Ar and $O_2$ gas atmosphere. The first hafnium oxide layer 104 which is higher in oxygen content than the second hafnium oxide layer is formed under the influence of the surface of the first electrode layer 103 exposed in atmosphere, when depositing the second hafnium oxide layer. The third hafnium oxide layer 106 which is higher in oxygen content than the second hafnium oxide layer 105 is formed by exposure to the plasma of Ar gas and $O_2$ gas in sputtering, after depositing the second hafnium oxide layer 105. The resistance variable layer 107 has a multi-layer structure in which the first hafnium oxide layer 104, the second hafnium oxide layer 105 and the third hafnium oxide layer 106 are stacked together.

Then, a 150 nm-thick Pt thin layer is deposited over the third hafnium oxide layer 106 as the second electrode layer 108, by the sputtering process.

Finally, by a photoresist step and dry etching, an element region 109 is formed. The element region 109 has a circular shape of a 3 μm diameter.

The nonvolatile memory element was manufactured according to the above explained manufacturing method. The greater detail of the manufacturing method will be described below.

[Composition of Hafnium Oxide Layer]

Firstly, manufacturing conditions and analysis result of oxygen content of the oxygen-deficient hafnium oxide layer in this embodiment will be described. The oxygen-deficient hafnium oxide layer was deposited by sputtering the Hf target under Ar (argon) and $O_2$ gas atmosphere, i.e., reactive sputtering.

Figure 2:
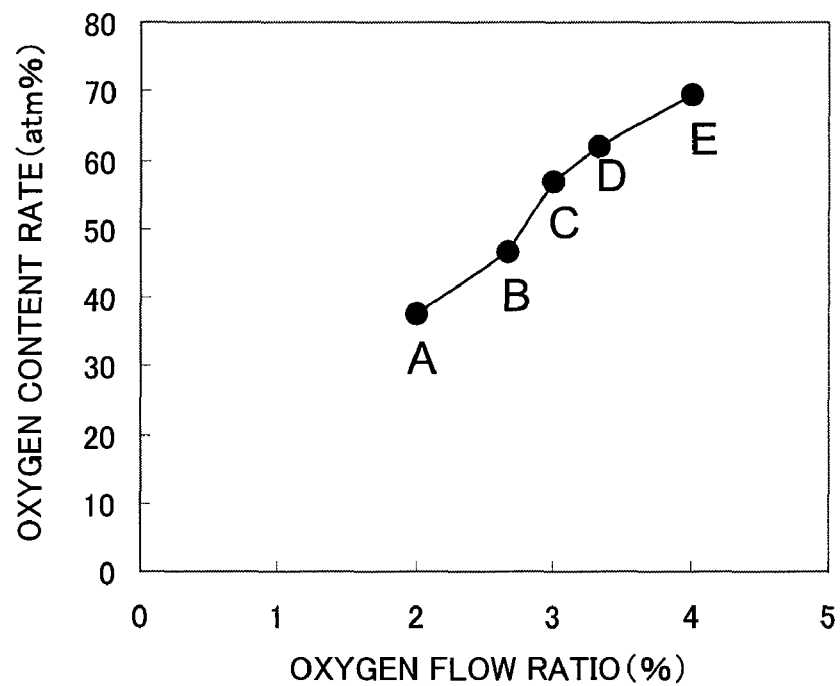
[FIG. 2]

Initially, a substrate was installed within a sputtering device and the sputtering device was evacuated to about $3 \times 10^{-5}$ Pa. Using Hf as a target, sputtering was conducted under the condition in which a power was set to 300 W and a total gas pressure of argon gas and oxygen gas was set to 0.9 Pa and a substrate temperature was set to 30 degrees centigrade. In this case, five kinds of hafnium oxide layers were deposited by changing the flow ratio of the $O_2$ gas to the Ar gas from 2% to 4%. To research the composition, a substrate formed by depositing 200 nm-thick $SiO_2$ on Si was used and sputtering time was adjusted so that the layer thickness of the hafnium oxide layer was about 50 nm. FIG. 2 shows Rutherford backscattering spectroscopy(RBS) analysis result of the composition of the hafnium oxide layers deposited as described above. In FIG. 2, A, B, C, D, and E denote the compositions of the five kinds of hafnium oxides with different $O_2$ gas flow ratios, respectively. As can be seen from FIG. 2, the oxygen content of the hafnium oxide layer was changed from about 37.7 at % ($HfO_{0.6}$) to about 69.4 at % ($HfO_{2.3}$) when the oxygen flow ratio was changed from 2% to 4%. From the above result, it was made clear that the oxygen content of the hafnium oxide layer can be controlled by the oxygen flow ratio, and oxygen-deficient hafnium oxides (A, B, C, and D) in which oxygen is deficient with respect to the oxygen content 66.7 at % of $HfO_2$ ($HfO_2$) which is a stoichiometric oxide of Hf, to a hafnium oxide (E) regarded as containing excess oxygen were deposited.

As the resistance variable layers 107, five kinds of nonvolatile memory elements having the compositions A, B, C, D, and E were manufactured. The thicknesses of the resistance variable layers 107 were all set to 30 nm.

Although in this embodiment, the Rutherford backscattering spectroscopy (RBS) was used for analysis of the hafnium oxide layer, instrument analysis method such as Auger electron spectroscopy (AES), X-ray photoelectron spectroscopy (XPS), or electron probe micro-analysis (EPMA) may be employed.

[Resistance Switching Characteristic of Hafnium Oxide Layer]

The resistance switching characteristics of the nonvolatile memory elements manufactured as described above were measured.

Figure 3:
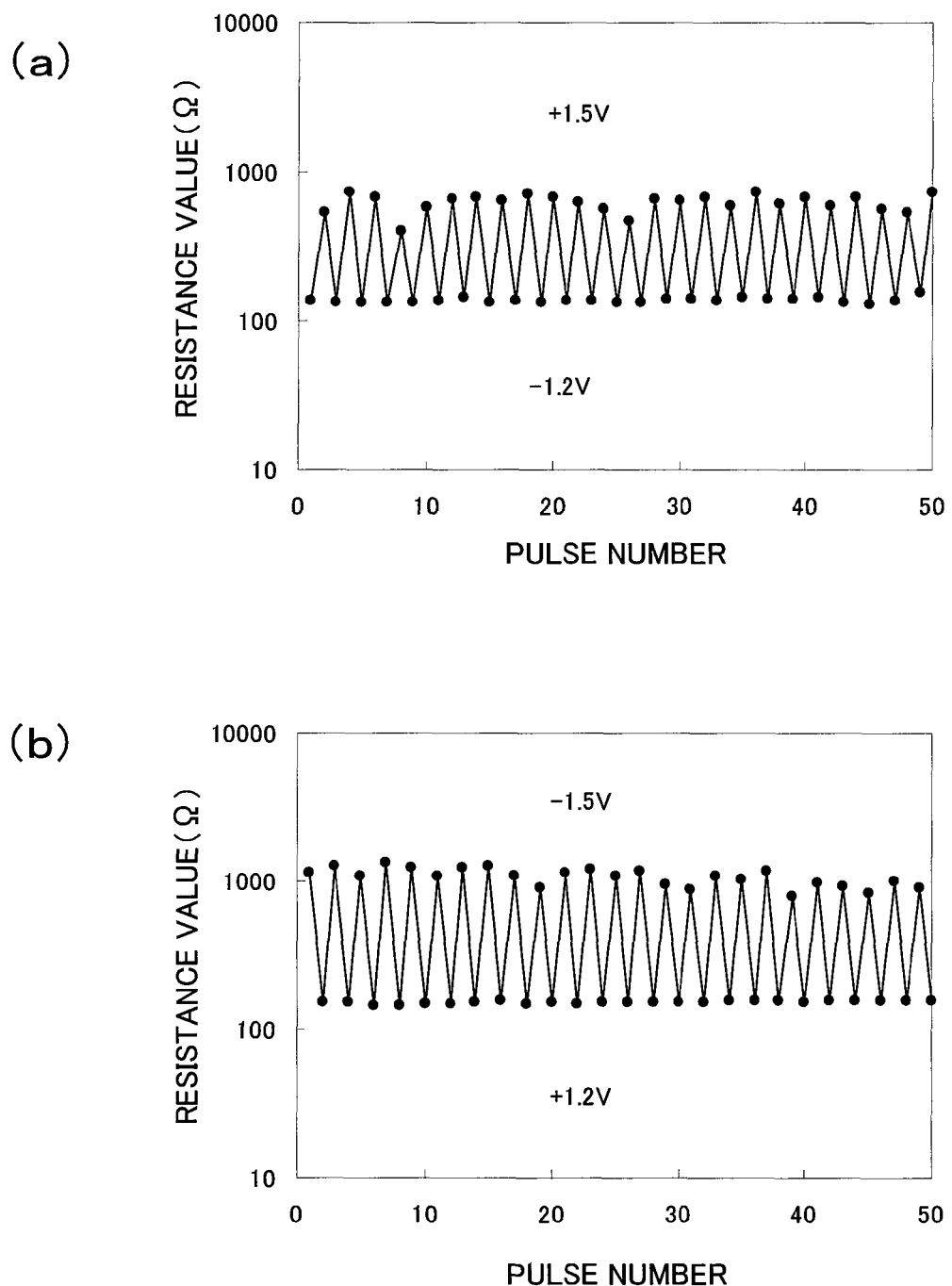
[FIG. 3]

Initially, the resistance switching characteristic of the nonvolatile memory element manufactured using a hafnium oxide layer with an oxygen gas flow ratio of 3.0% and the composition C, the characteristic of which is generated by applying the electric pulses was researched in detail. FIGS. 3(a) and 3(b) show how the nonvolatile memory element switches the resistance when the electric pulses are applied repetitively.

In FIGS. 3(a) and 3(b), a horizontal axis indicates the number of electric pulses applied between the lower electrode 103 and the upper electrode 108 and a vertical axis indicates the resistance value.

FIG. 3(a) shows a measurement result of resistance obtained by alternately applying electric pulses having voltages of +1.5V and −1.2V and a pulse width of 100 nsec to the upper electrode 108 on the basis of the lower electrode 103. In this case, the resistance value switched to about 500~700Ω by applying the electric pulse of the voltage of +1.5V, while the resistance value switched to about 140Ω by applying the electric pulse of the voltage of −1.2V. That is, the nonvolatile memory element switched to the high-resistance state when the electric pulse was applied to the upper electrode 108 such that the voltage of the upper electrode 108 was higher than the voltage of the lower electrode 103.

FIG. 3(b) shows a measurement result obtained by changing the balance of the voltages applied such that a negative voltage is larger in magnitude. In this case, the electric pulses of the voltages of −1.5V and +1.2V were applied to the upper electrode 106 on the basis of the lower electrode 103. Upon the application of the electric pulse of −1.5V, the element switched to the high-resistance state, and the resistance value switched to about 900~1200Ω, while upon the application of the electric pulse of +1.2V, the element switched to the low-resistance state, and the resistance value switched to about 150Ω. That is, the nonvolatile memory element switched to the low-resistance state when the electric pulse of a higher voltage than the electric pulse applied to the lower electrode 103 is applied to the upper electrode 108. The nonvolatile memory element exhibited the operation which is the reverse of the operation corresponding to the measurement shown in FIG. 3(a).

In order to seek a cause of the above described two-mode resistance switching of the nonvolatile memory element according to the polarity of the applied voltage, the inventors researched a portion of the nonvolatile memory element where resistance switching occurs. To this end, an element F was manufactured. In the present case, illustrated is a result obtained using oxygen-deficient tantalum which is regarded as operating in a mechanism similar to that of Hf.

Figure 4:
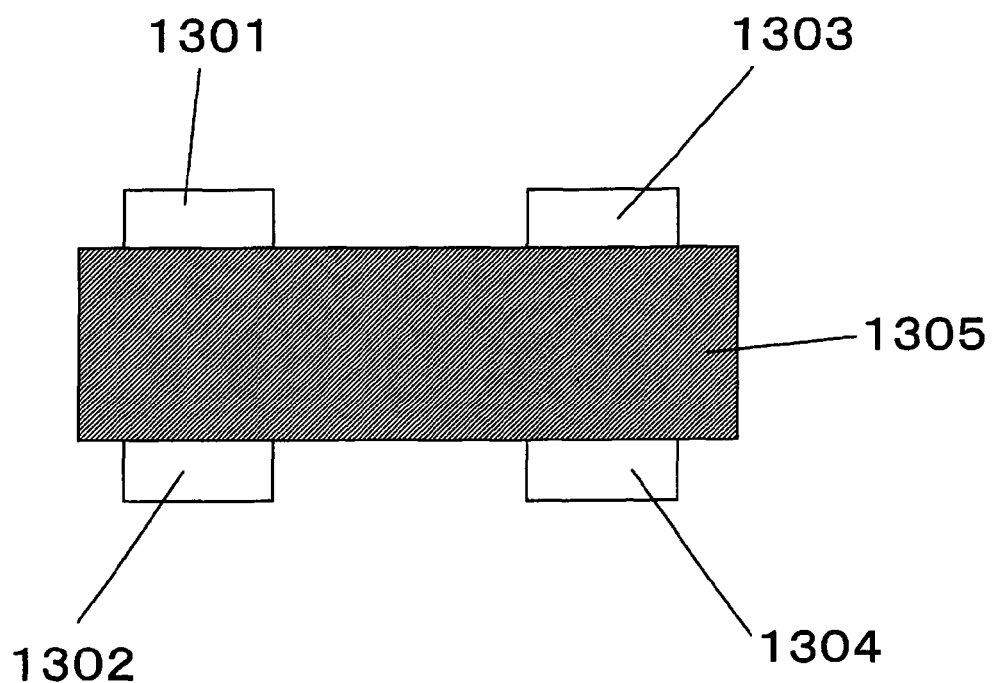
[FIG. 4]

FIG. 4 is a schematic view of the cross-section of the element F. As shown in FIG. 4, two electrodes made of Pt were formed at each of the upper and lower sides of an oxygen-deficient tantalum oxide layer 1305 of 100 nm, i.e., four electrodes 1301~1304 in total were formed. Then, the voltages of +2.0V and −1.5V were applied with a pulse width of 100 nsec to the electrode 1301 on the basis of the electrode 1302. The element F switched to a high-resistance state when the electric pulse of the voltage of +2.0V was applied and switched to a low-resistance state when the electric pulse of the voltage of −1.5V was applied. The resistance values were measured among the four electrodes under the condition in which the resistance between the electrode 1301 and the electrode 1302 was switched in this way. To be specific, +2.0V was applied between the electrode 1301 and the electrode 1302 to switch resistance between the electrode 1301 and the electrode 1302 to a high-resistance state, and under this condition, the resistance value between the electrode 1301 and the electrode 1303, the resistance value between the electrode 1301 and the electrode 1304, the resistance value between the electrode 1302 and the electrode 1303, the resistance value between the electrode 1302 and the electrode 1304, and the resistance value between the electrode 1303 and the electrode 1304 were respectively measured. Then, −1.5V was applied between the electrode 1301 and the electrode 1302 to switch resistance between the electrode 1301 and the electrode 1302 to a low-resistance state, and under this condition, the resistance values between the electrodes were measured in a manner similar to that described above.

The above-mentioned measurement was repeated 10 times and the resulting resistance values between the electrodes are illustrated in table 1.

TABLE 1

|  | Resistance value(Ω) generated by applying +2.0 V between electrodes 1301 and 1302 | Resistance value(Ω) generated by applying −1.5 V between electrodes 1301 and 1302 |
|---|---|---|
| Between electrodes 1301 and 1302 | 546 | 262 |
| Between electrodes 1301 and 1303 | 1351 | 1276 |
| Between electrodes 1301 and 1304 | 1075 | 828 |
| Between electrodes 1302 and 1303 | 1153 | 1153 |
| Between electrodes 1302 and 1304 | 704 | 704 |
| Between electrodes 1303 and 1304 | 698 | 698 |

The result was such that switching of the resistance value was observed only in the portions including the electrode 1301 and the resistance values between the portions which did not include the electrode 1301 did not substantially change. From this fact, it should be understood that resistance switching occurred in response to the voltage applied between the electrode 1301 and the electrode 1302 only in the region the vicinity of the electrode 1301.

From the above result, in the resistance variable element using the oxygen-deficient tantalum oxide as the resistance variable layer, resistance switching occurs only in a region near the electrode in the oxygen-deficient tantalum oxide layer. Also, it is considered that resistance switching occurs in the region in the vicinity of the electrode at a high potential side, when the element switches to the high-resistance (in this case, a voltage with a higher potential is applied to the electrode 1301 with respect to the electrode 1302 when the element switches to the high-resistance state).

It is considered that the same phenomenon occurs in the case of using the oxygen-deficient hafnium oxide of transition metal. This is because resistance switching phenomenon caused by an electric field applied to the electrode is observed in the nonvolatile memory element using the hafnium oxide layer as the resistance variable layer, as in the case of tantalum.

In light of the above results, it is considered that resistance switching occurred in two modes, i.e., a mode (upper electrode mode) in which resistance switching occurred in the vicinity of the interface between the upper electrode 108 and the resistance variable layer 107 and a mode (lower electrode mode) in which resistance switching occurred in the vicinity of the interface between the lower electrode 103 and the resistance variable layer 107.

It may be said that the nonvolatile memory element of this embodiment is a bipolar nonvolatile memory element which switches its resistance in response to electric pulses of different polarities and switches the resistance at a high-speed in response to the electric pulses of a relatively short pulse width of 100 nsec.

[Oxygen Content and Resistance Switching Characteristic of Hafnium Oxide Layer]

Among the oxygen-deficient hafnium oxides deposited as described above, an oxygen content of the oxygen-deficient hafnium oxide which exhibits resistance switching was researched.

As a result, in the nonvolatile memory elements including the hafnium oxide layers of the composition B (oxygen flow ratio: about 2.7%, oxygen content: about 46.6 at %), the composition C (oxygen flow ratio: about 3.0%, oxygen content: about 56.8 at %), and the composition D (oxygen flow ratio: about 3.3%, oxygen content: about 62 at %) in FIG. 2, the high-resistance value was favorably not less than four times as large as the low-resistance value. Since the resistance switching characteristic of the nonvolatile memory element including the hafnium oxide layer of the composition C has been already described in detail, the resistance switching characteristics of the nonvolatile memory elements including the hafnium oxide layers of the composition B and the composition D will be described.

Figure 5:
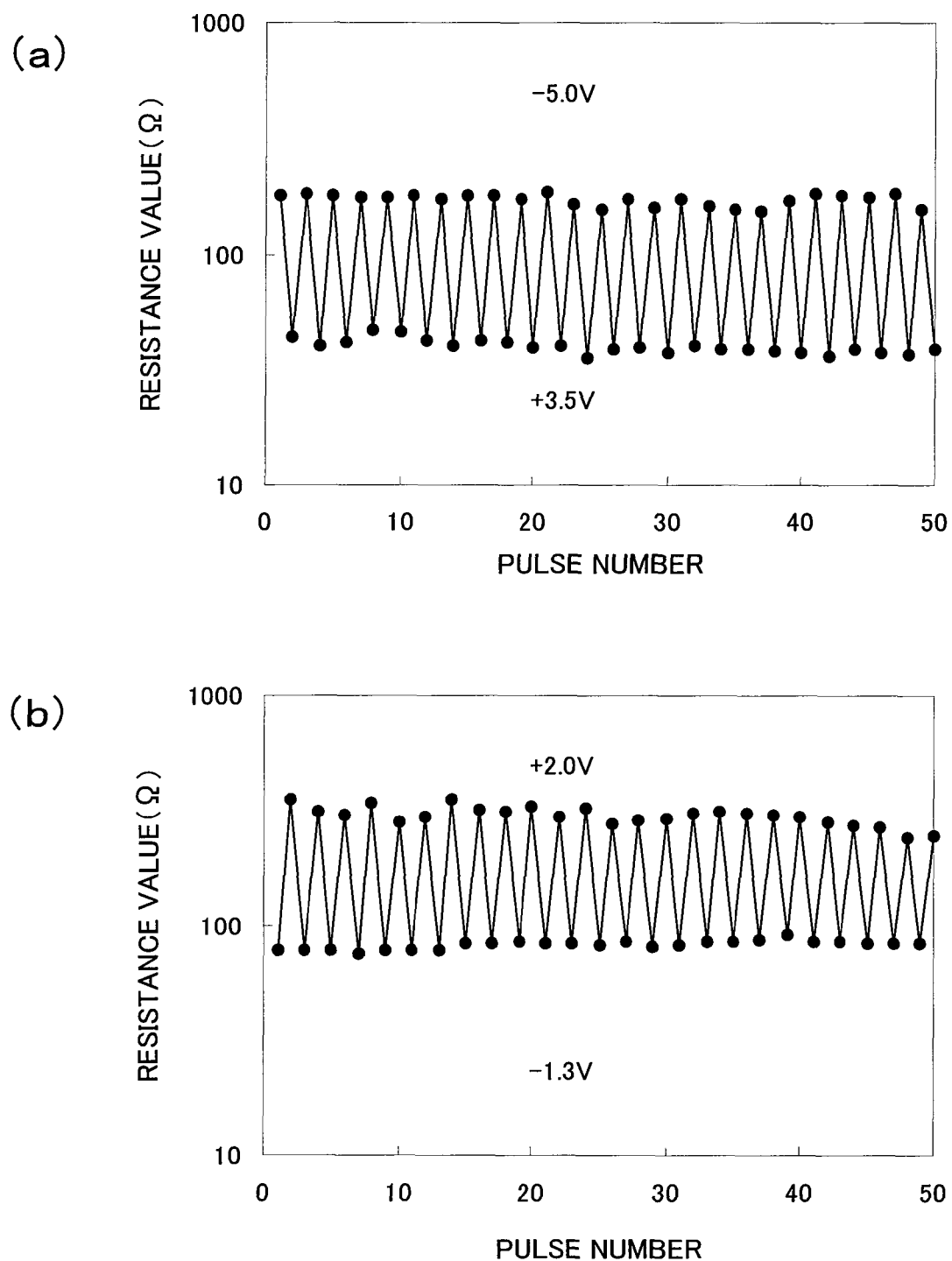
[FIG. 5]
Figure 6:
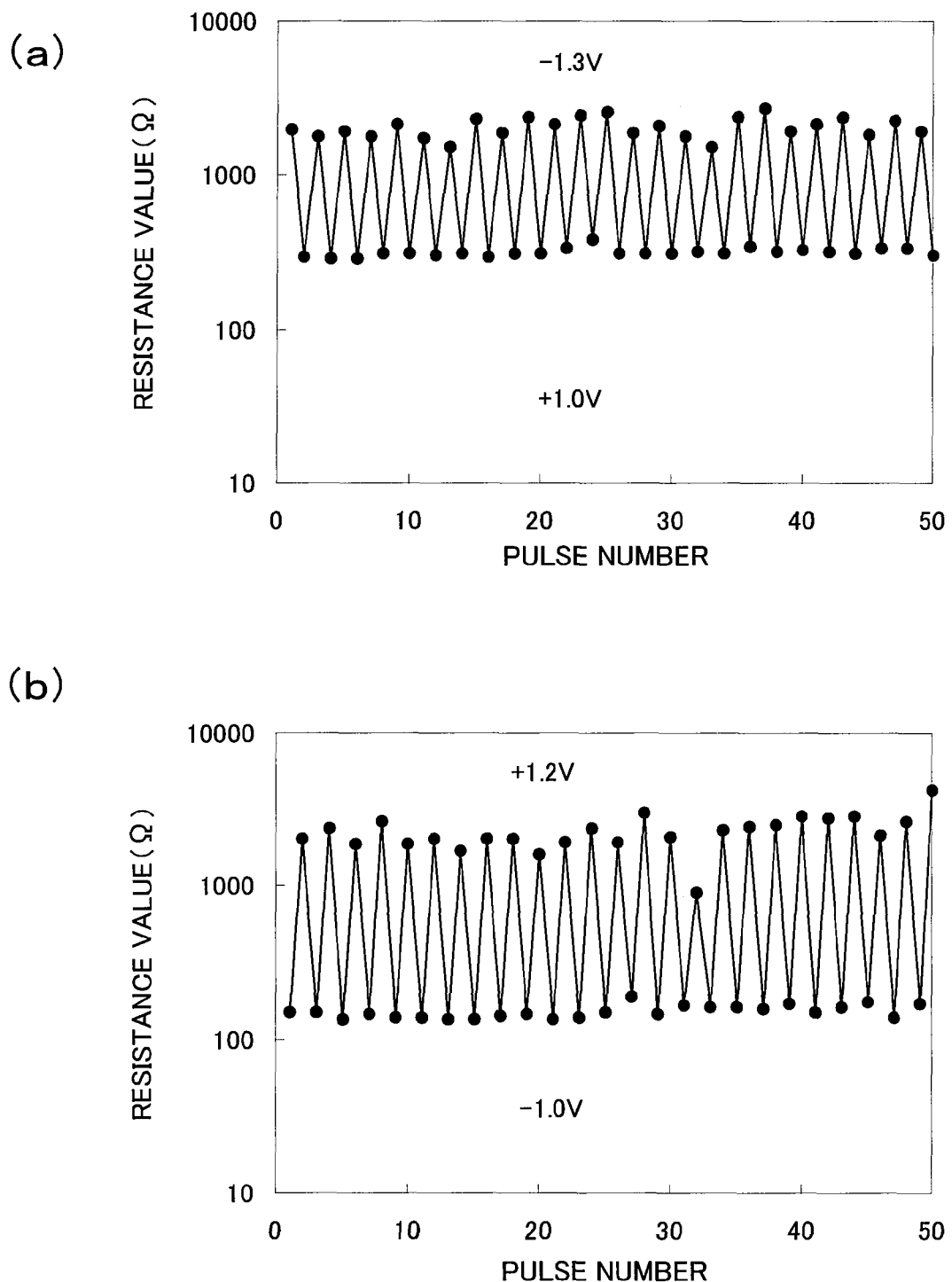
[FIG. 6]

FIGS. 5(a) and 5(b) show measurement results of the resistance switching characteristic of the nonvolatile memory element including the hafnium oxide layer of the composition B, with respect to the number of pulse applications, and FIGS. 6(a) and 6(b) show measurement results of the resistance switching characteristic of the nonvolatile memory element including the hafnium oxide layer of the composition D, with respect to the number of pulse applications. As used herein, a mode in which the nonvolatile memory element switches to the high-resistance state when a negative voltage is applied to the upper electrode on the basis of the lower electrode and switches to the low-resistance state when a positive voltage is applied to the upper electrode on the basis of the lower electrode is expressed as A mode, while a mode in which the element switches to the high-resistance state when a positive voltage is applied to the upper electrode on the basis of the lower electrode and switches to the low-resistance state when a negative voltage is applied to the upper electrode on the basis of the lower electrode is expressed as B mode. FIG. 5(a) and FIG. 6(a) show measurement results of the operation in the A mode, while FIGS. 5(b) and FIG. 6(b) show measurement results of the operation in the B mode. In the element including the hafnium oxide layer of the composition B, the resistance switching abruptly occurred upon application of a pulse of 100 nsec and the resistance switched four times or more in magnitude in the measurement result of A mode shown in FIG. 5(a), whereas the resistance switching did not occur abruptly with a pulse of 100 nsec, but the resistance value increased by applying a pulse of a long pulse width of 100 μsec and +4V, and thereafter resistance switching occurred by repetitive application of the pulse of 100 nsec. The electric processing for causing the nonvolatile memory element to initiate the resistance switching is called "forming" which is a process for operating the nonvolatile memory element correctly. In practice, it is desired that the resistance switching be initiated without the "forming." In the element including the hafnium oxide layer of the composition D, as shown in FIGS. 6(a) and 6(b), the resistance switching occurs four times or more in magnitude in the two modes. However, in the element including the hafnium oxide layer of the composition D, an initial resistance before applying the electric pulse was several MΩ and thus high. Therefore, the nonvolatile memory element was softly broken down with the electric pulse of 2~3V and 100 nsec and thereafter the element switched the resistance by applying 100 nsec pulse. This soft breakdown processing may be regarded as "forming."

From the above result, it can be said that the resistance variable layer performs a bipolar operation and exhibits high-speed switching when a composition range in which the oxygen content is 46.6 to 62 at % corresponding to the oxygen flow ratio of 2.6% to 3.3% with which the resistance variable layers were deposited, i.e., the range of x, $0.9 \leq x \leq 1.6$ in the case where the resistance variable layer is expressed as $HfO_x$ is a more proper range of the resistance variable layer (oxygen content=46.6 at % corresponds to x=0.9, and the oxygen content=62 at % corresponds to x=1.6). In the composition analysis according to the RBS method, the analysis value of the oxygen content has a precision of about ±5 at %. Therefore, the composition range of x contains a measurement error associated with this precision, and in actuality, there is a chance that the composition range in which the oxygen content is 42~67 at % is this appropriate composition range.

In addition, since the resistance switching occurs without "forming" in a composition range in which the oxygen content is 46.6 to 56.8 at % corresponding to the oxygen flow ratio of 2.6% to 3.0% with which the resistance variable layers were deposited, i.e., the range of x, $0.9 \leq x \leq 1.3$ in the case where the resistance variable layer is expressed as $HfO_x$, and therefore this range is a more appropriate range of the resistance variable layer (oxygen content=46.6 at % corresponds to x=0.9, and the oxygen content=56.8 at % corresponds to x=1.3).

In the above composition ranges, resistance switching occurs in the B mode and in the A mode. For this reason, there is a case where the resistance value increases when a positive voltage is applied to the upper electrode and a case where the resistance value decreases when the positive voltage is applied to the upper electrode. Therefore, there exists a problem that the resistance value is not uniquely determined according to the polarity of the voltage applied to the electrode. In the nonvolatile memory element of the composition B in which the oxygen content is 46.6 at % corresponding to the oxygen flow ratio of 2.6% with which the resistance variable layer was deposited, i.e., x=0.9 in the case where the resistance variable layer is expressed as $HfO_x$, the resistance switching occurs without the "forming" in the A mode, and did not occur without the "forming" in the B mode. Therefore, advantageously, the above mentioned problem will not arise.

In a nonvolatile memory element of the composition A in which an oxygen content of the hafnium oxide layer is about 37.7 at % ($HfO_{0.6}$), corresponding to the oxygen flow ratio is 2.0%, which was manufactured as a comparative example, the initial resistance was low, the "forming" could not be conducted, and the resistance switching did not occur. Also, in a nonvolatile memory element of the composition E in which an oxygen content of the hafnium oxide layer is about 69.4 at % ($HfO_{2.3}$) corresponding to an oxygen flow ratio is 4%, which was manufactured as a comparative example, the initial resistance was very high, the element could not be softly broken down even though a DC voltage of 5V was applied, and the resistance switching did not occur.

[Analysis of Resistance Variable Layer]

As described above, in the resistance variable layer which is the oxygen-deficient hafnium oxide layer, the resistance switching occurs in the region in the vicinity of the interface between the resistance variable layer and the upper electrode and the region in the vicinity of the interface between the resistance variable layer and the lower electrode. Therefore, detailed analysis was carried out for the structure of the region in the vicinity of the interface between the oxygen-deficient hafnium oxide layer and the upper electrode and the structure of the region in the vicinity of the interface between the oxygen-deficient hafnium oxide layer and the lower electrode.

To analyze the structure of the resistance variable layer 100 in the nonvolatile memory element 100, a hafnium oxide layer having the composition C in which an oxygen content is 56.8%, and having a thickness of 50 nm was deposited and analyzed. To carry out the analysis, a region having a substantial size in which oxygen-deficient hafnium oxide is deposited is required. Therefore, a sample to be analyzed was prepared, in which an oxygen-deficient hafnium oxide is deposited over a substrate which is formed by depositing a 200 nm-thick oxide layer on a single crystal silicon substrate and does not have an element pattern.

Figure 7:
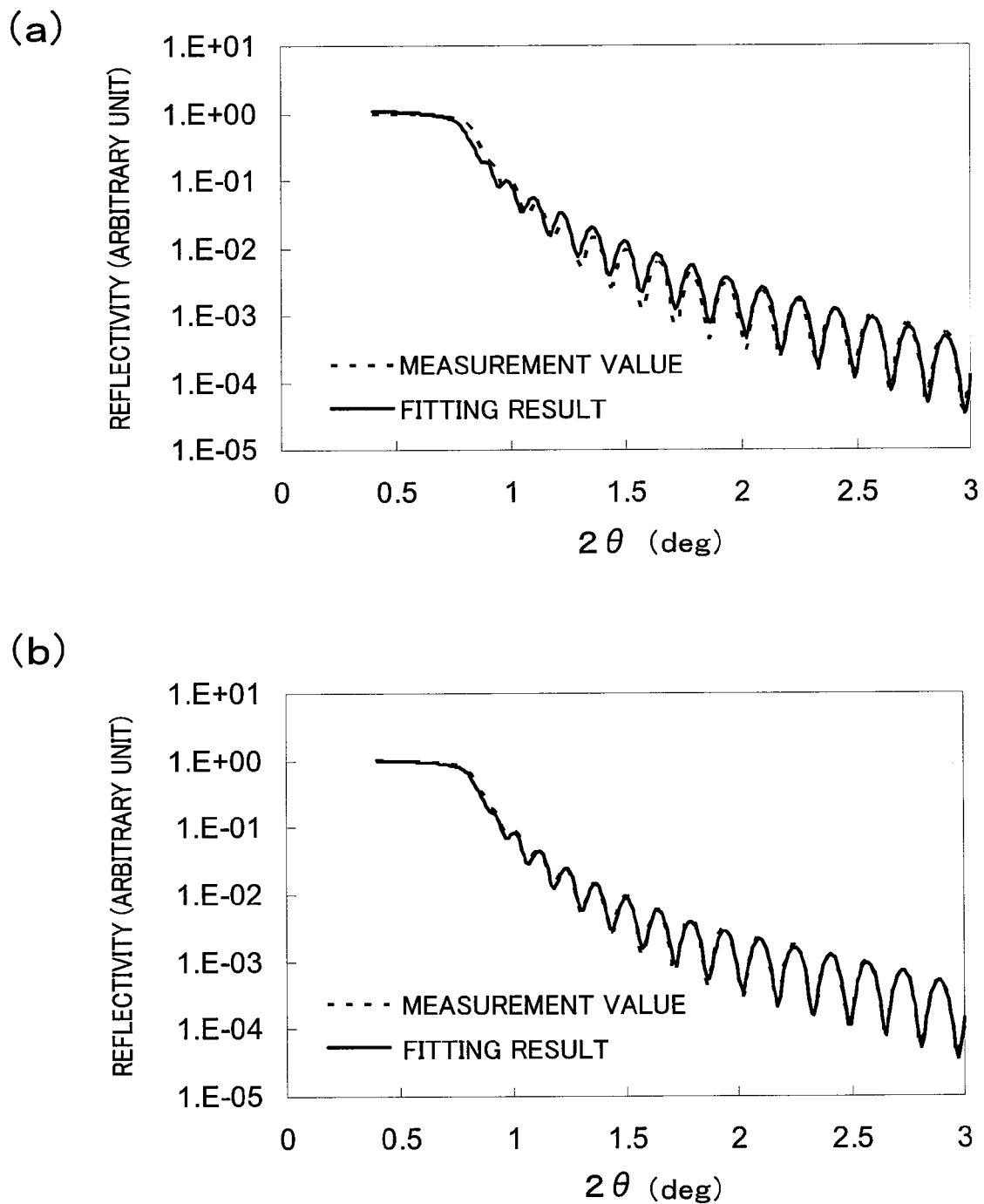
[FIG. 7]

The analysis method used is called an X-ray reflectometory. In this technique, an X-ray is caused to enter the surface of the sample at a small angle, and intensity of the reflected X-ray is measured (manufacturer: Rigaku, software name: X-ray reflectivity data processing software). In the present case, shifting of the reflectivity of the X-ray on the sample surface was measured, while changing an angle θ formed between the X-ray and the sample surface and a detector angle (angle θ with respect to the sample surface) were changed in association with each other. Fitting was performed assuming a model having a proper structure with respect to the spectrum, and a thickness and refractive index of the resistance variable layer in the sample to be analyzed was evaluated. In the present case, parameters of the fitting are thickness of each layer and δ (=1-refractive index) of the multi-layer structure of the oxygen-deficient hafnium oxide. FIG. 7 shows measurement result.

In FIG. 7, a horizontal axis indicates an angle (2θ) and a vertical axis indicates the reflectivity of the X-ray. FIG. 7(a) indicates a pattern obtained by actual measurement of the X-ray reflectivity of the sample to be analyzed (broken line) and a result of fitting performed assuming that a single oxygen-deficient hafnium oxide layer is present on the substrate (solid line). Likewise, FIG. 7(b) indicates a reflectivity pattern obtained by the measurement (broken line) and a result of fitting performed assuming that three oxygen-deficient hafnium oxide layers are present on the substrate(solid line). As can be seen from FIG. 7(a), the measurement value and the fitting result roughly conform to each other, but there is some difference in a strict sense. In contrast, as can be seen from FIG. 7(b), the reflectivity pattern obtained by actual measurement and the reflectivity pattern obtained by the fitting favorably conform to each other and cannot be distinguished from each other.

From the above result, it may be judged that the oxygen-deficient hafnium oxide layer is composed of three layers which are a first oxygen-deficient hafnium oxide layer which is closer to the lower electrode, a second oxygen-deficient hafnium oxide layer at a center, and a third oxygen-deficient hafnium oxide layer which is closer to the upper electrode.

The values obtained by analysis of the result of the fitting performed assuming the above triple-layer structure were such that the thickness of the first oxygen-deficient hafnium oxide layer was 3.9 nm, δ of the first oxygen-deficient hafnium oxide layer was $24.2 \times 10^{-6}$, the thickness of the second oxygen-deficient hafnium oxide layer was 45.5 nm, δ of the second oxygen-deficient hafnium oxide layer was $26.0 \times 10^{-6}$, the thickness of the third oxygen-deficient hafnium oxide layer was 3.3 nm, and δ of the third oxygen-deficient hafnium oxide layer was $24.2 \times 10^{-6}$. It is difficult to derive correct compositions from the values of δ. But, the compositions may be roughly estimated from the fact that δ of metal Hf is $31.2 \times 10^{-6}$, δ of $HfO_2$ having the stoichiometric composition is $24.0 \times 10^{-6}$, etc. That is, it may be considered that the second oxygen-deficient hafnium oxide layer comprises a Hf oxide having a non-stoichiometric composition according to the initial setting, because of the fact that δ of the second oxygen-deficient hafnium oxide layer is an intermediate value of δ of metal Hf and δ of $HfO_2$. Also, the first and third oxygen-deficient hafnium oxide layers may be presumed as Hf oxides close to $HfO_{1.94}$, from the values of δ and presumed as Hf oxides which are very close to $HfO_2$ (oxygen content: 66.7%) having a stoichiometric composition.

Hereinafter, an analysis procedure of the X-ray reflectometry will be explained.

For easier calculation performed later, fitting is performed assuming that the resistance variable layer has a double-layer structure. To be specific, δ and thickness of a high-oxygen-concentration layer and δ and thickness of a low-oxygen-concentration layer were calculated by performing the fitting on assumption that the high-oxygen-concentration layer is present in the vicinity of the upper electrode and the other layers are low-oxygen-concentration layers (calculation step 1). The fitting was performed by "least-squares method".

In the calculation step 1, rough values of δ and thickness of the high-oxygen-concentration layer present in the vicinity of the electrode are obtained.

The following calculation is performed on assumption that the resistance variable layer has a triple-layer structure.

Under the condition in which the values of δ and thickness of the high-oxygen-concentration layer which were calculated in the calculation step 1 were initial values of δ and thickness of the first resistance variable layer, and the value of δ of the first resistance variable layer was equal to the value of δ of the third resistance variable layer, δ and thickness of the first resistance variable layer, δ and thickness of the second resistance variable layer, and δ and thickness of the third resistance variable layer were calculated again by the fitting (calculation step 2). In this step, δ and thickness of the first resistance variable layer, δ and thickness of the second resistance variable layer, and δ and thickness of the third resistance variable layer were found by the fitting.

In general, when using the X-ray reflectometry, it is not easy to measure a layer located most distant from the surface of the triple-layer structure. The data of the third resistance variable layer with high precision is used as data of the first resistance variable layer in calculation of the multi-layer structure of the resistance variable layer in the present case. This is because the resistance switching phenomenon occurred in the sample C in both of the B mode and the A mode, and therefore it was presumed that the high-oxygen-concentration layer similar to the third layer was formed in the vicinity of the first electrode layer.

The results of the samples A~E which were measured by the X-ray reflectometry are illustrated in table 2.

that in the samples described in Embodiment 1, the first layer and the second layer having substantially the same structures as those of the samples for analysis are formed. The reason may be that in the samples described in Embodiment 1, the hafnium oxide was deposited by sputtering on the lower electrode exposed in atmosphere, similarly to the samples used in the analysis, and therefore it is presumed that the oxygen content of the oxygen-deficient hafnium oxide which is closer to the lower electrode was higher. However, the third layers of the samples described in Embodiment 1 are different from the samples used in the analysis. The third layers of the samples described in Embodiment 1 were formed in such a manner that the hafnium oxide was deposited and then the upper electrode was formed without exposure to atmosphere. But, it is presumed that in the se samples, the oxygen content of the surface layer was higher, because the hafnium oxide was exposed to the plasma of Ar gas and $O_2$ gas for a specified time, after deposited by the sputtering. In contrast, in the samples used in the above analysis, there is a chance that the thickness of the third layer increased a little, because the hafnium oxide deposited by the sputtering was exposed to the plasma of Ar gas and $O_2$ gas for a specified time, and then was taken out from the sputtering device and exposed in outside air (before the X-ray reflectometry was conducted). However, it is generally known that oxidation progresses at a high speed in an initial stage but then gradually lowers its pace. From this, it is presumed that when the hafnium oxide layer with a high-oxygen concentration is formed by exposure to the oxygen plasma within the sputtering device, the amount of the hafnium oxide layer which increases outside the sputtering device is small.

Subsequently, the relationship between the multi-layer structures of the resistance variable layers of the samples A~E and the resistance switching phenomena will be described with reference to table 2. Regarding the samples B, C, and D which exhibited resistance switching, x in the case where the second layer is expressed as $HfO_x$ increased as the oxygen flow ratio increased. Also, y in the case the first layer and the

TABLE 2

| | | | A | B | C | D | E |
|---|---|---|---|---|---|---|---|
| | Oxygen flow ratio (%) | | 2.0 | 2.7 | 3.0 | 3.3 | 4.0 |
| X-ray reflectometry result | Third layer | Thickness(nm) | 3.6 | 3.4 | 3.3 | 3.6 | — |
| | | δ | $24.5 \times 10^{-6}$ | $24.4 \times 10^{-6}$ | $24.2 \times 10^{-6}$ | $24.1 \times 10^{-6}$ | — |
| | | y | 1.86 | 1.89 | 1.94 | 1.97 | — |
| | Second layer | Thickness(nm) | 38.1 | 42.7 | 45.5 | 47.7 | 60.3 |
| | | δ | $28.9 \times 10^{-6}$ | $27.2 \times 10^{-6}$ | $26.0 \times 10^{-6}$ | $25.3 \times 10^{-6}$ | $22.7 \times 10^{-6}$ |
| | | x | 0.65 | 1.12 | 1.43 | 1.65 | 2.35 |
| | First layer | Thickness(nm) | 2.7 | 3.5 | 3.9 | 3.9 | — |
| | | δ | $24.5 \times 10^{-6}$ | $24.4 \times 10^{-6}$ | $24.2 \times 10^{-6}$ | $24.1 \times 10^{-6}$ | — |
| | | y | 1.86 | 1.89 | 1.94 | 1.97 | — |

From the results of the samples B, C, and D which operated, it may be said that a suitable thickness of the first layer or the third layer is not less than 3 nm and not more than 4 nm. It may be said that a suitable value of y of the first layer or the third layer is $1.8 < y < 2.0$.

It was found that in the composition E, favorable fitting result was obtained only with the second oxygen-deficient hafnium oxide layer, and the first and third oxygen-deficient hafnium oxide layers do not exist. From these results, it may be judged that to achieve the resistance switching, the mere existence of the high-resistance hafnium oxide layer in the vicinity of the electrode is not sufficient, but another hafnium oxide layer containing a proper oxygen content is needed.

The above results are measurement results of the samples prepared for analysis, as described initially. It is considered third layer are expressed as $HfO_y$ increased a little and was closer to 2 as the oxygen flow ratio increased. Regarding the thicknesses of the first layer and the third layer, the thickness of the first layer which was not particularly exposed to outside air increased as the oxygen flow ratio increased. Regarding the sample A which did not exhibit resistance switching, x of the second layer, y of the first layer, and the thickness of the first layer were smaller than those of the samples B, C, and D. Regarding the sample E which did not exhibit resistance switching, the resistance variable layer did not have a multi-layer structure and consists of the second layer. x of the second layer of the resistance variable layer was larger than 2.

From these results, it may be said that x of the second layer, y of the first layer or the third layer, the thickness of the first layer or third layer are required to fall within suitable ranges to enable resistance switching. To be specific, from the results of the samples B, C, and D that operated, the suitable range of x of the second layer is $0.9 \leq x \leq 1.6$, the suitable range of y of the first layer or the third layer is $1.8 < y < 2.0$, the suitable thickness of the first layer or the third layer is not less than 3 nm and not more than 4 nm.

In the samples B and C, resistance switching was able to occur without "forming," while in the sample D, "forming" such as the soft breakdown was required to cause resistance switching. Therefore, from the results of the samples B and C, the suitable range of x of the second layer is $0.9 \leq x \leq 1.3$, the suitable range of y of the first layer or the third layer is $1.8 < y < 2.0$, the suitable thickness of the first layer or the third layer is not less than 3 nm and not more than 4 nm, and it may be said that in these ranges, the resistance switching can occur without "forming."

In the sample B, resistance switching was able to occur without "forming" in the A mode, but "forming" for applying a positive long pulse to the upper electrode side is required to cause resistance switching in the B mode. Since the element is operable without "forming" only in the A mode, it is possible to avoid a problem that the resistance value is not uniquely determined according to the polarity of the voltage applied to the electrode. Therefore, from the result of the sample B, the suitable range of x of the second layer is $x=0.9$, the suitable range of y of the first layer or the third layer is $1.8 < y < 2.0$, the suitable thickness of the first layer or the third layer is not less than 3 nm and not more than 4 nm, and in these ranges, it may be possible to avoid a problem that the resistance value is not uniquely determined according to the polarity of the voltage applied to the electrode.

The first hafnium oxide layer and the third hafnium oxide layer may be deposited using a sputtering process or a chemical vapor deposition process. For example, in the case of using the sputtering process, hafnium oxide which has a high oxygen content and is in a high-resistance state can be deposited by performing sputtering with a high oxygen gas flow ratio during the deposition. In the case of the sputtering condition described in the above "manufacturing method of nonvolatile memory element," the first hafnium oxide layer and the third hafnium oxide layer can be deposited by setting the oxygen flow ratio to about 4% or higher.

[Initial Resistance of Nonvolatile Memory Element]

Figure 8:
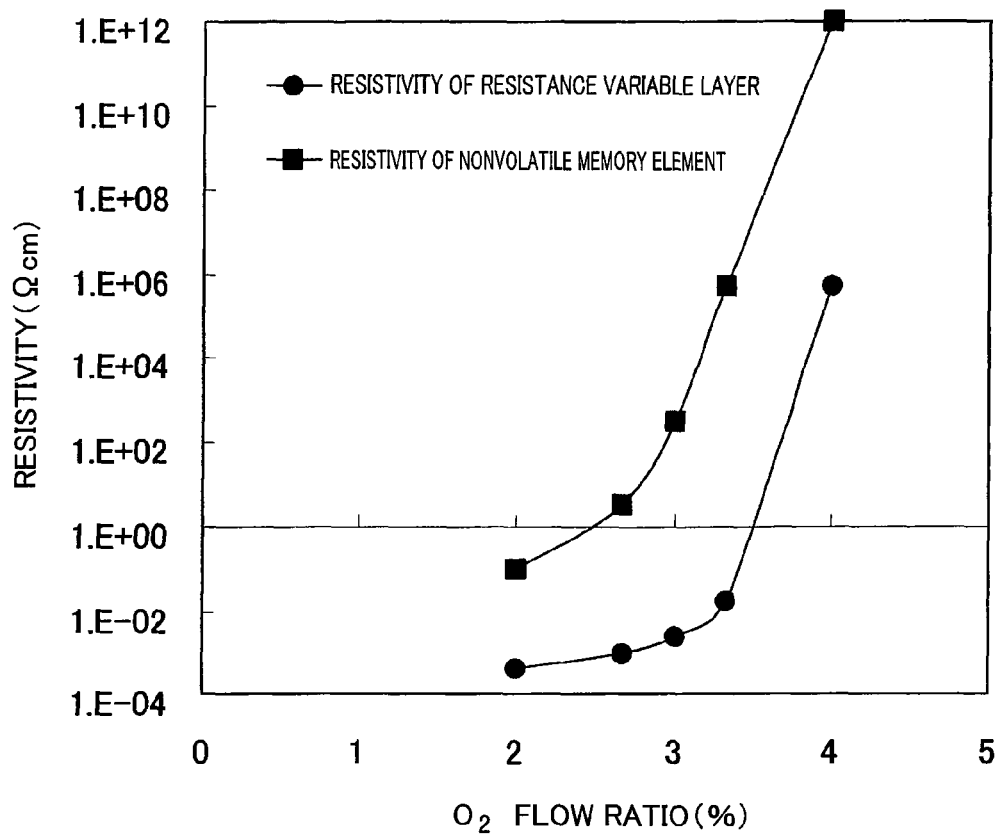
[FIG. 8]

The initial resistance of the nonvolatile memory element 100, which suggests a potential of existence of the first oxygen-deficient hafnium oxide layer and the third oxygen-deficient hafnium oxide, was measured. The initial resistance of the nonvolatile memory element 100 in each example was measured by applying a low voltage of 50 mV which is lower than the threshold voltage (e.g., about 1V) between the first electrode layer 103 and the second electrode layer 108 in each example and by measuring a current flowing therethrough. In addition, the resistivity of the resistance variable layer in the state of the nonvolatile memory element was found based on the relationship of initial resistance=[resistivity of resistance variable layer]×[thickness of resistance variable layer])/[area (area of element region 109 in FIG. 1) of nonvolatile memory element]. FIG. 8 shows the result. FIG. 8 also shows the resistivity of the resistance variable layer found from the result of measurement of sheet resistance of the second hafnium oxide layer.

As can be seen from FIG. 8, the resistivity of the resistance variable layer increases as the oxygen flow ratio, i.e., oxygen content increases, and the resistivity of the nonvolatile memory element 100 in the element state increases with a value which is a single or more digit larger as the oxygen content increases. From the result, it may be presumed that the first oxygen-deficient hafnium oxide layer and the third oxygen-deficient hafnium oxide layer which are in a high-resistance state exist in addition to the second oxygen-deficient hafnium oxide layer which has a relatively small resistance value, and the thickness of the first oxygen-deficient hafnium oxide layer and the thickness of the third oxygen-deficient hafnium oxide layer increase as the oxygen flow ratio increases.

[Mechanism of Resistance Switching Phenomenon]

The role of the first hafnium oxide layer and the role of the third hafnium oxide layer have not been made clear yet at present time when the mechanism of the resistance switching phenomenon is not clear. Assuming that the resistance switching of the resistance variable nonvolatile memory element of this embodiment is caused to occur by the migration of oxygen atoms at the interface between the electrode and the hafnium oxide layer, the first or third hafnium oxide layer may possibly serves to effectively apply a voltage to the region in the vicinity of the interface. In other words, it is considered that the resistance switching phenomenon occurs due to the fact that the oxygen atoms gather to or diffuse from the region in the vicinity of the interface between the electrode and the first or third hafnium oxide layer by an electric field. To be specific, in the B mode, negatively charged oxygen atoms gather to the vicinity of the second electrode 108 side upon application of a positive voltage to the second electrode 108 shown in FIG. 1 and form a high-resistance layer, causing the element to switch to a high-resistance state. On the other hand, upon application of a negative voltage, the oxygen atoms diffuse into the hafnium oxide layer, resulting in a decrease in resistance. If the third hafnium oxide layer 106 which is the high-resistance layer is present at the interface, this region is subjected to a high voltage, and the oxygen atoms are implanted into the high-resistance layer 106. Thereby, the oxygen content of the high-resistance layer 106 further increases and is close to $HfO_2$ having a stoichiometric composition which is known as an insulator. As a result, the resistance of the element itself increases and the element switches to the high-resistance state.

In light of the polarity of the applied electric pulse and the polarity of the oxygen ions, in the B mode, the element switches to the high-resistance state when a positive voltage is applied to the upper electrode on the basis of the lower electrode, and therefore the resistance switching phenomenon in the vicinity of the upper electrode is dominant.

In contrast, in the A mode, the element switches to the high-resistance state when a negative voltage is applied to the upper electrode on the basis of the lower electrode, and therefore the resistance switching phenomenon in the vicinity of the lower electrode is dominant.

For example, in a case where resistance switching is caused to occur in the region in the vicinity of the upper electrode, the voltage is applied uniformly to the hafnium oxide layer 105 if the third hafnium oxide layer 106 which is the high-resistance layer is not present at the interface, making it difficult to form in the vicinity of the interface, the high-resistance layer which is close to the insulator. As a result, resistance switching phenomenon is difficult to occur.

From the above result, when $|V1|>|V2|$ is satisfied in a case where the positive pulse voltage applied to the upper electrode on the basis of the lower electrode is expressed as V1 and the negative pulse voltage applied to the upper electrode on the basis of the lower electrode is expressed as V2, the B mode easily occurs, while when $|V1|<|V2|$ is satisfied, the A mode easily occurs.

The second hafnium oxide layer 105 serves as a supply source for supplying the oxygen atoms contained therein to the third hafnium oxide layer when the electric pulse having a positive voltage is applied to the electrode which is in contact with the third hafnium oxide layer 106.

Therefore, it is considered that the oxygen content of the second hafnium oxide layer 105 significantly affects whether or not the resistance variable element switches its resistance in response to a short electric pulse of about 100 nsec. It is also considered that the second hafnium oxide must have a proper oxygen content to enable the resistance variable element to switch its resistance.

In light of the fact that the hafnium oxide layer in the vicinity of the electrode serves to apply a high voltage to a localized region of the resistance variable layer which is located in the vicinity of the electrode, it is essential that the hafnium oxide layer in the vicinity of the electrode have a higher resistance than the second hafnium oxide layer which is the source layer for supplying oxygen. Therefore, it may be sufficient that the first or third hafnium oxide layer in the case where it is expressed as $HfO_y$ fall within the range of $x<y<2$. Also, likewise, it may be sufficient that the thickness of the first or third hafnium oxide layer is suitable for serving to apply a high voltage to a localized region.

For easiness of manufacturing, the thickness of the first or third hafnium oxide layer is suitably not less than 1 nm in practice. In light of an increase in the element resistance due to miniaturization in the future, the thickness of the first or third hafnium oxide layer is suitably not more than 5 nm in practice.

In accordance with the above mentioned mechanism, the resistance variable layer may have a multi-layer structure of a modification illustrated below.

Figure 9:
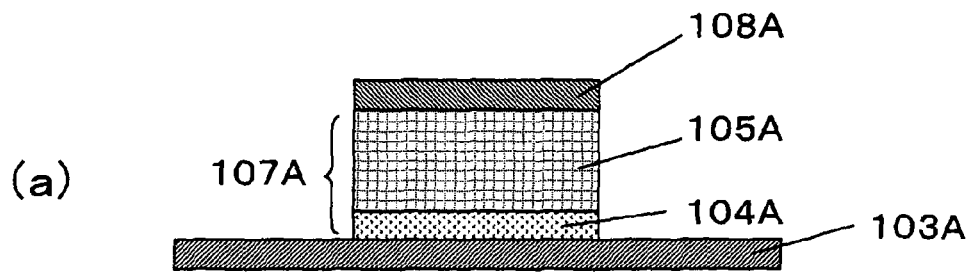
[FIG. 9]
Figure 9:
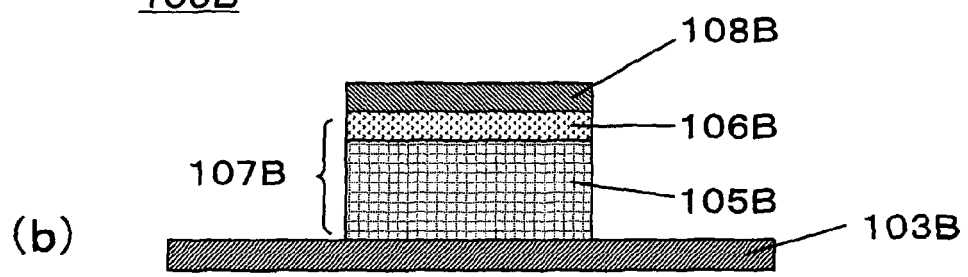
Figure 9:
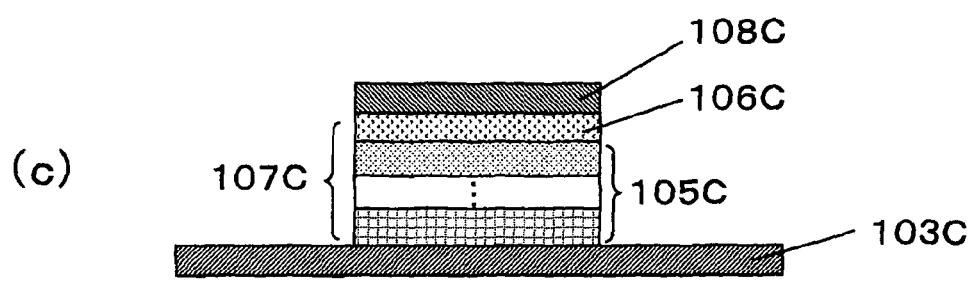

FIG. 9 is a cross-sectional view showing a configuration of a modification of the nonvolatile memory element according to Embodiment 1 of the present invention. In FIG. 9, the substrate and the oxide layer are omitted for the sake of convenience.

As shown in FIG. 9(a), a high-oxygen-concentration hafnium oxide layer 104A ($HfO_y$, $1.8<y<2.0$) may be deposited only over a lower electrode 103A. In this case, a resistance variable layer 107A includes a high-oxygen-concentration hafnium oxide layer 104A and a hafnium oxide layer 105A ($HfO_x$, $0.9 \leq x \leq 1.6$) which are stacked in this order. In this case, the high-oxygen-concentration hafnium oxide is present only in the region in the vicinity of the lower electrode. Therefore, the lower electrode mode is dominant, and only the operation in the A mode occurs.

As shown in FIG. 9(b), a resistance variable layer 107B may include a hafnium oxide layer 105B ($HfO_x$, $0.9 \leq x \leq 1.6$) and a high-oxygen-concentration hafnium oxide layer 106B ($HfO_y$, $1.8<y<2.0$) which are stacked in this order. In this case, the high-oxygen-concentration hafnium oxide is present only in the region in the vicinity of the upper electrode. Therefore, the upper electrode mode is dominant and only the operation in the B mode occurs.

As should be appreciated, in the embodiments shown in FIGS. 9(a) and 9(b), since the resistance switching easily occurs only in the vicinity of either the upper or lower electrode, and therefore these embodiments are desirable as the resistance variable nonvolatile memory element which performs the bipolar operation.

In the example shown in FIG. 9(a), it is difficult to form the high-oxygen-concentration hafnium oxide layer 104A by oxidation, and it is necessary to deposit it by the sputtering process or chemical vapor deposition process. For example, in the sputtering process, sputtering is performed under a condition in which the oxygen gas flow ratio in deposition is high, thereby depositing a high-oxygen-concentration hafnium oxide layer which has a high oxygen content and has a high-resistance value. Then, the hafnium oxide layer is deposited by setting the oxygen gas flow ratio low, thereby completing the structure shown in FIG. 9(a).

As shown in FIG. 9(c), a hafnium oxide layer 105C ($HfO_x$, $0.9 \leq x \leq 1.6$) may consist of two or more hafnium oxide layers which are different in composition, rather than a single layer. Or, the hafnium oxide layer 105C may be formed of a hafnium oxide layer whose composition changes continuously. In this case, it should be noted that the oxygen content of a high-oxygen-concentration hafnium oxide layer 106C ($HfO_y$, $1.8<y<2.0$) must be higher than the oxygen content of each layer constituting the hafnium oxide layer 105C. Although in the example illustrated in FIG. 9(c), the high-oxygen-concentration hafnium oxide layer 106C may be in contact with the second electrode, it may be provided at the first electrode side as shown in FIG. 9(a), or otherwise at the second electrode side as shown in FIG. 9(b).

As shown in FIG. 9(a) to (c), the resistance variable layer 107A to 107C are sandwiched between the first electrode layer 103A to 103C located at a lower side and the second electrode layer 108A to 108C located at an upper side, and the both end portions of the resistance variable layer 107A to 107C are respectively aligned with the both end portions of the second electrode layer 108 A to 108C in the cross-sectional view. But this is exemplary and the present invention is not limited to this configuration. Hereinafter, modifications will be described.

Figure 10:
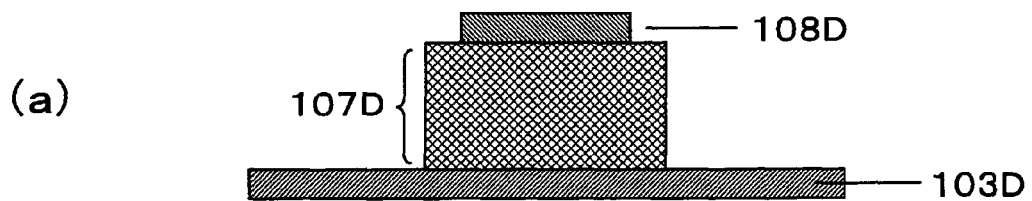
[FIG. 10]
Figure 10:
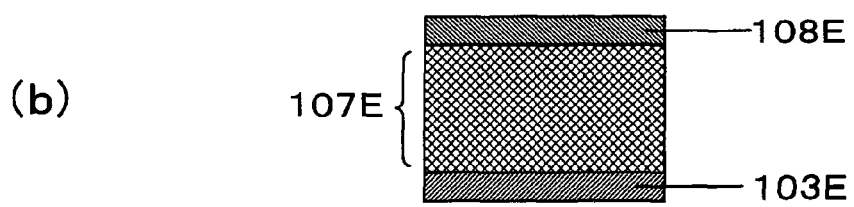
Figure 10:
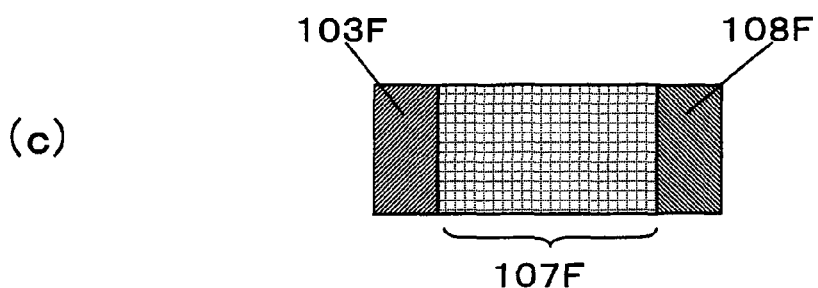

FIGS. 10(a) to 10(c) are cross-sectional views showing configurations of modifications of the nonvolatile memory element according to Embodiment 1 of the present invention. In FIGS. 10(a) to 10(c), the substrate and the oxide layer are omitted for the sake of convenience. The resistance variable layer consisting of several hafnium oxide layers is drawn as a single layer. Actually, this resistance variable layer has a multi-layer structure shown in FIG. 1 or FIG. 9.

In the modification shown in FIG. 10(a), a first electrode layer 103D, a resistance variable layer 107D, and a second electrode layer 108D are stacked in this order, and the both end portions of the first electrode layer 103D, the resistance variable layer 107D, and the second electrode layer 108D are not aligned with each other in the cross-sectional view. In contrast, in the modification shown in FIG. 10(b), a first electrode layer 103E, a resistance variable layer 107E, and a second electrode layer 108E are stacked together, and the both end portions of the first electrode layer 103E, the resistance variable layer 107E, and the second electrode layer 108E are aligned with each other in the cross-sectional view. The nonvolatile memory element of the present invention may be configured in this way.

Although the nonvolatile memory element 100 of this embodiment and the above described two modifications have a structure in which the resistance variable layer is sandwiched between the upper and lower electrodes, the electrodes may be provided at both end surfaces of the resistance variable layer to flow a current in a direction parallel to the main surface of the resistance variable layer. To be specific, as shown in FIG. 10(c), a first electrode 103F may be provided at one end surface of a resistance variable layer 107F and a second electrode 108F may be provided at the other end surface to flow a current in a direction parallel to the main surface of the resistance variable layer 107F.

The nonvolatile memory element of this embodiment includes an insulating layer, although not shown. A fluorine-doped oxide layer may be deposited as an insulating layer by a chemical vapor deposition process or the like. The insulating layer may be omitted.

The nonvolatile memory element according to this embodiment includes a wire layer, although not shown, in the same manner. As a wire material, for example, Pt, Ir, Pd, Ag, Au, Cu, W, Ni, or TiN may be used. The wire layer may be omitted.

The sputtering conditions including the oxygen gas flow ratio in Embodiment 1 are not limited to the above illustrated values, but are variable depending on the configuration or state of the device. Although hafnium is used as the target during deposition of the first hafnium oxide layer, a sputtering process which does not use a reactive gas such as oxygen may be used by using hafnium oxide as a target. The power, gas pressure or the substrate temperature during the sputtering, etc, are not limited to the above described conditions. Furthermore, the first hafnium oxide layer may be formed using the layer forming technique such as the chemical vapor deposition process.

The high-oxygen-concentration hafnium oxide layer may be formed by the oxygen plasma processing, thermal oxidation in oxygen atmosphere, oxidation by ozone, natural oxidation in air, oxidation utilizing a reaction with water molecules or the like adsorbed onto the substrate, etc may be used. Moreover, the high-oxygen-concentration hafnium oxide layer may be formed by the layer forming technique such as the sputtering or the chemical vapor deposition process.

(Embodiment 2)

The above described nonvolatile memory element according to Embodiment 1 is applicable to nonvolatile semiconductor devices having various configurations. A semiconductor device according to Embodiment 2 is a nonvolatile semiconductor device which includes the nonvolatile memory element according to Embodiment 1 and is so-called a cross-point semiconductor device in which a nonvolatile memory element intervenes at an intersection (three-dimensional cross point) between a word line and a bit line.

[Configuration of Semiconductor Device According to Embodiment 2]

Figure 11:
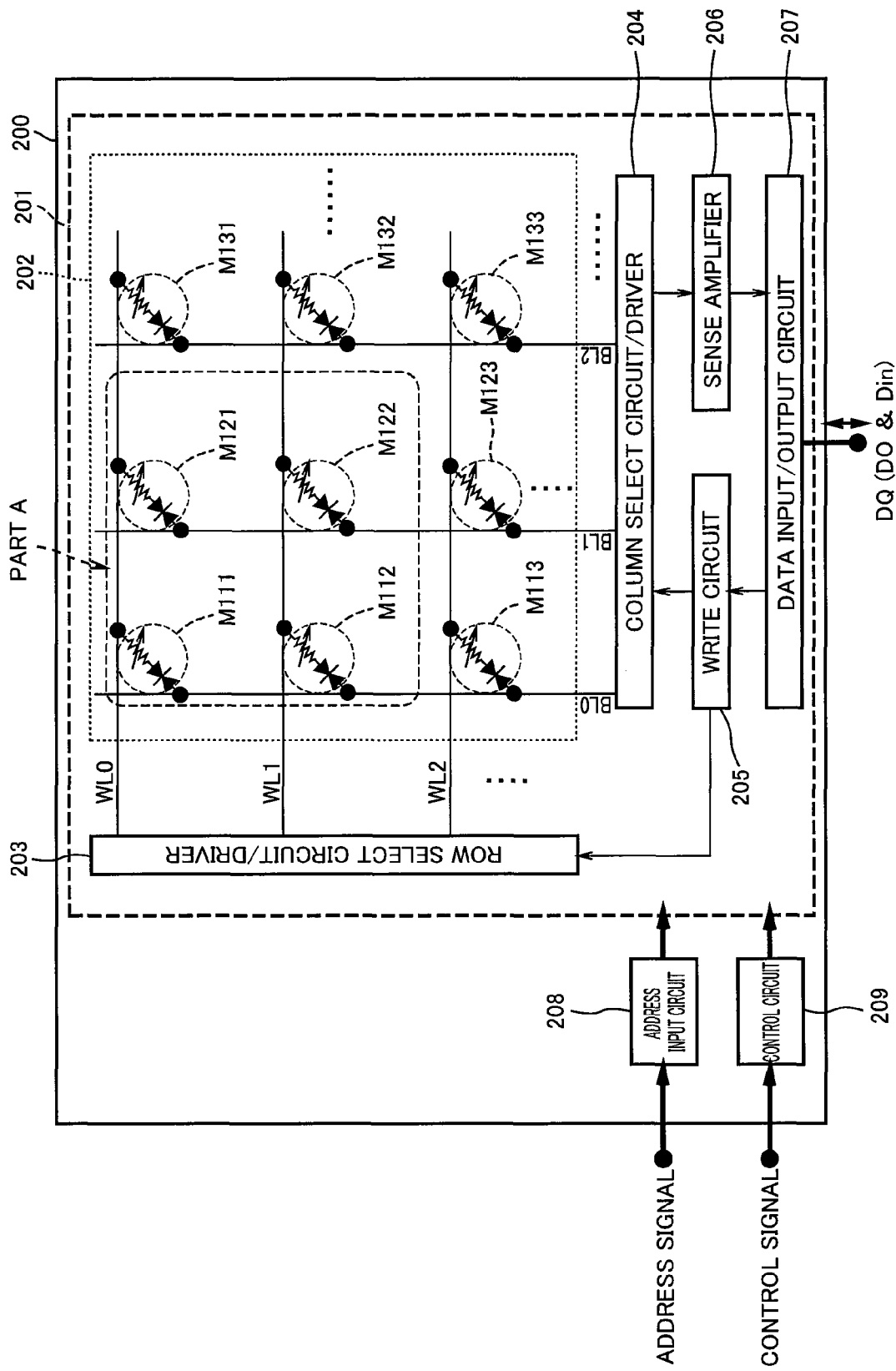
[FIG. 11]
Figure 12:
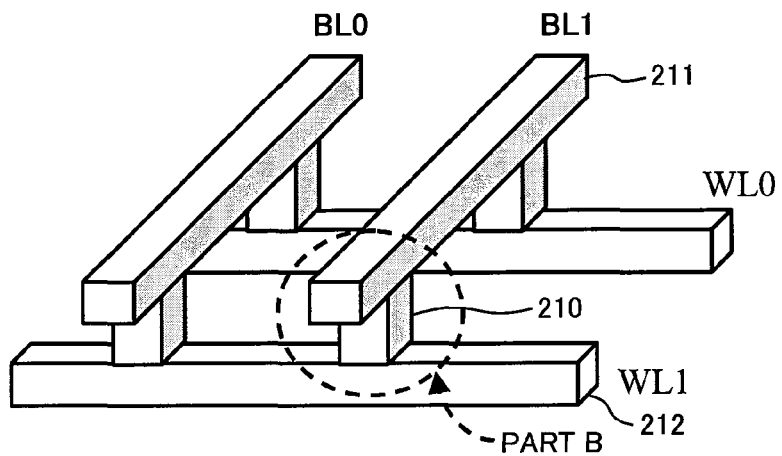
[FIG. 12]

FIG. 11 is a block diagram showing a configuration of a nonvolatile semiconductor device according to Embodiment 2 of the present invention. FIG. 12 is a perspective view showing a configuration (configuration corresponding to 4 bits) in part A of FIG. 11.

As shown in FIG. 11, a nonvolatile semiconductor device 200 according to this embodiment includes a memory main section 201 on a semiconductor substrate. The memory main section 201 includes a memory array 202, a row select circuit/driver 203, a column select circuit/driver 204, a write circuit 205 for writing data, a sense amplifier 206 which detects an amount of a current flowing in a selected bit line and determines the data as "1" or "0," and a data input/output circuit 207 which executes input and output processing of input and output data via a terminal DQ. The nonvolatile semiconductor device 200 further includes an address input circuit 208 which receives an address signal externally input, and a control circuit 209 for controlling the operation of the memory main section 201, based on a control signal externally input.

As shown in FIGS. 11 and 12, the memory array 202 includes plural word lines WL0, WL1, WL2, . . . which are formed on the semiconductor substrate to extend in parallel with each other, and plural bit lines BL0, BL1, BL2, . . . which are formed above the plural word lines WL0, WL1, WL2, . . . , so as to extend in parallel with each other within a plane parallel to a main surface of the semiconductor substrate and so as to three-dimensionally cross the plural word lines WL0, WL1, WL2, . . . .

Further, plural memory cells M111, M112, M113, M121, M122, M123, M131, M132, M133, . . . (hereinafter expressed as "memory cells M111, MC112, . . . ") are arranged in matrix so as to respectively correspond to the three-dimensional cross points of the plural word lines WL0, WL1, WL2, . . . , and the plural bit lines BL0, BL1, BL2 . . . .

The memory cells M111, M112, . . . correspond to the nonvolatile memory elements according to Embodiment 1, and each of them has a resistance variable layer comprising hafnium oxide having a multi-layer structure. It should be noted that in this embodiment, each of these memory cells M111, M112, . . . includes a current rectifying element as described later.

The memory cells M111, M112, . . . in FIG. 11 are identified by reference numeral 210 in FIG. 12.

The address input circuit 208 receives an address signal from an external circuit (not shown), and outputs a row address signal and a column address signal to the row select circuit/driver 203 and to the column select circuit/driver 204, respectively, based on the address signal. The address signal is a signal indicating the address of a specified memory cell to be selected from among the plural memory cells M111, M112, . . . . The row address signal is a signal indicating a row address in the address indicated by the address signal, and the column address signal is a signal indicating a column address in the address indicated by the address signal.

In a write cycle of data, the control circuit 209 outputs to the write circuit 205, a write signal for causing application of a write voltage, according to the input data Din input to the data input/output circuit 207. In a read cycle of data, the control circuit 209 outputs to the column select circuit/driver 204, a read signal for causing application of a read voltage.

The row select circuit/driver 203 receives the row address signal output from the address input circuit 208, selects one from among the plural word lines WL0, WL1, WL2, . . . based on the row address signal and applies a predetermined voltage to the selected word line.

The column select circuit/driver 204 receives a column address signal output from the address input circuit 208, selects one from among the plural bit lines BL0, BL1, BL2, . . . based on the column address signal and applies the write voltage or the read voltage to the selected bit line.

Receiving the write signal output from the control circuit 209, the write circuit 205 outputs to the row select circuit/driver 203, a signal for causing application of a voltage to the selected word line, and outputs to the column select circuit/driver 204 a signal for causing application of a write voltage to the selected bit line.

In the read cycle of data, the sense amplifier 206 detects an amount of a current flowing in the selected bit line which is a read target, and determines the data as "1" or "0." The resulting output data DO is output to the external circuit via the data input/output circuit 207.

[Configuration of Nonvolatile Memory Element Included in Nonvolatile Semiconductor Device According to Embodiment 2]

Figure 13:
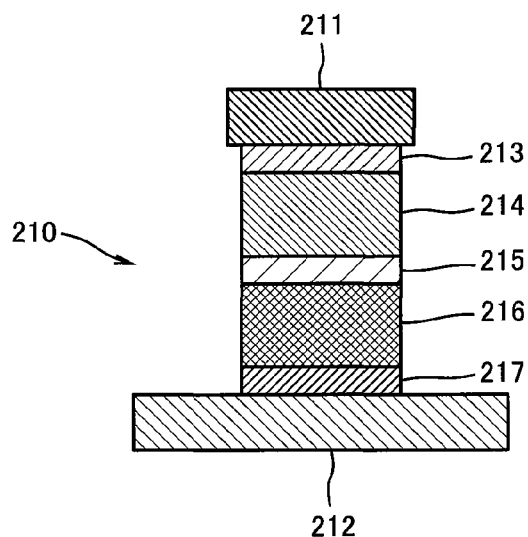
[FIG. 13]

FIG. 13 is a cross-sectional view showing a configuration of the nonvolatile memory element included in the nonvolatile semiconductor device according to Embodiment 2 of the present invention. In FIG. 13, a configuration of part B in FIG. 12 is shown.

As shown in FIG. 13, a nonvolatile memory element 210 included in the nonvolatile semiconductor device according to this embodiment intervenes between a lower wire 212 (corresponding to the word line WL1 in FIG. 12) which is a copper wire and an upper wire 211 (corresponding to the bit line BL1 in FIG. 12) which is a copper wire, and includes a lower electrode 217, a current rectifying element 216, an inner electrode 215, a resistance variable layer 214, and an upper electrode 213 which are stacked in this order.

The inner electrode 215, the resistance variable layer 214, and the upper electrode 213 correspond to the first electrode layer, the resistance variable layer, and the second electrode layer in the nonvolatile memory element according to Embodiment, respectively. Therefore, the resistance variable layer 214 is formed as in Embodiment 1 and Embodiment 2.

The current rectifying element 216 is connected in series to the resistance variable layer 214 via the inner electrode 215 made of TaN. The current rectifying element 216 is an element which is typically a diode, and exhibits a nonlinear current characteristic with respect to a voltage. The current rectifying element 216 has a bidirectional current characteristic with respect to a voltage, and is placed in a conductive state at a predetermined threshold voltage Vf (e.g., not lower than +1V or not higher than −1V based on one electrode as a reference).

Hafnium and hafnium oxide are materials generally used in a semiconductor process, and may be highly compatible with the semiconductor process. Therefore, they can be easily incorporated into the existing semiconductor manufacturing process.

[Configuration of Modification of Nonvolatile Memory Element Included in Nonvolatile Semiconductor Device According to Embodiment 2]

The configuration of the nonvolatile memory element included in the nonvolatile semiconductor device according to this embodiment is not limited to that shown in FIG. 13, but may have a configuration shown below.

FIGS. 14(a) to 14(g) are cross-sectional views showing configurations of modifications of the nonvolatile memory element included in the nonvolatile semiconductor device according to Embodiment 2 of the present invention.

Figure 14:
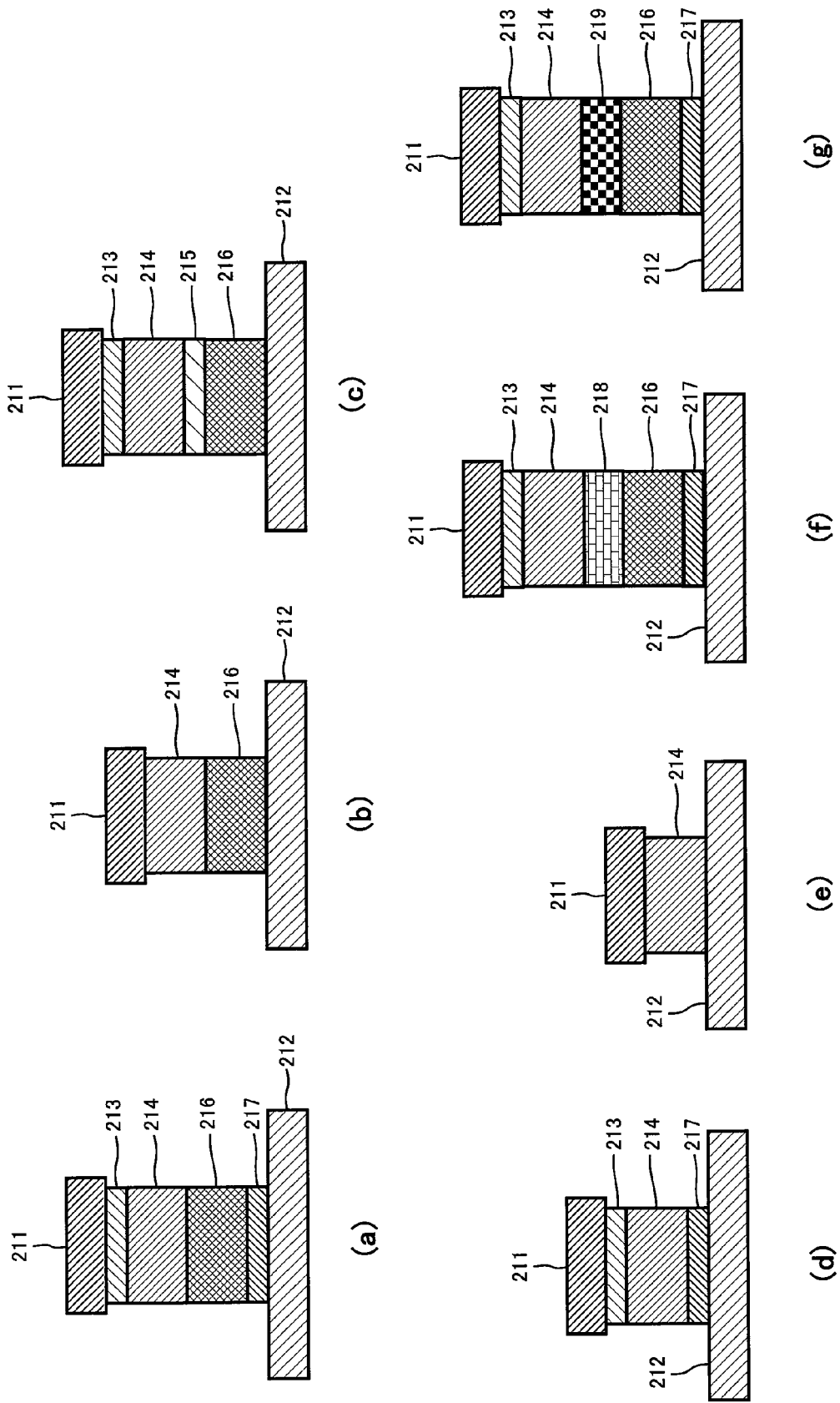
[FIG. 14]

FIG. 14(a) shows a configuration in which the resistance variable layer 214 is formed on the current rectifying element 216, and the inner electrode is omitted, unlike the configuration of FIG. 13.

FIG. 14(b) shows a configuration in which the resistance variable layer 214 is formed on the current rectifying element 216, and the lower electrode, the inner electrode, and the upper electrode are omitted, unlike the configuration of FIG. 13. FIG. 14(c) shows a configuration in which the lower electrode is omitted, unlike the configuration of FIG. 13. Alternatively, a configuration in which the upper electrode is omitted may be used, although not shown.

FIG. 14(d) shows a configuration in which the inner electrode and the current rectifying element are omitted, unlike the configuration of FIG. 13. FIG. 14(e) shows a configuration in which the upper electrode and the lower electrode are further omitted.

FIG. 14(f) shows a configuration in which the inner electrode is omitted but instead an ohmic resistance layer 218 is provided unlike the configuration of FIG. 13. FIG. 14(g) shows a configuration in which a second resistance variable layer 219 is provided instead of the inner electrode.

In the above modifications, in the configuration in which the upper electrode is omitted, the upper wire 211 serves as the upper electrode of the nonvolatile memory element, while in the configuration in which the lower electrode is omitted, the lower wire 212 serves as the lower electrode of the nonvolatile memory element.

When the memory cells are fewer in number, a bypass current flowing to unselected memory cells is reduced. In that case, the above described current rectifying element may be dispensed with.

As should be understood from the above, for the nonvolatile memory elements included in the nonvolatile semiconductor device according to this embodiment, various configurations may be used.

[Example of Configuration of Nonvolatile Semiconductor Device Having a Multi-Layer Structure]

The memory arrays of the nonvolatile semiconductor device according to this embodiment shown in FIGS. 11 and 12 may be three-dimensionally stacked to attain a nonvolatile semiconductor device having a multi-layer structure.

Figure 15:
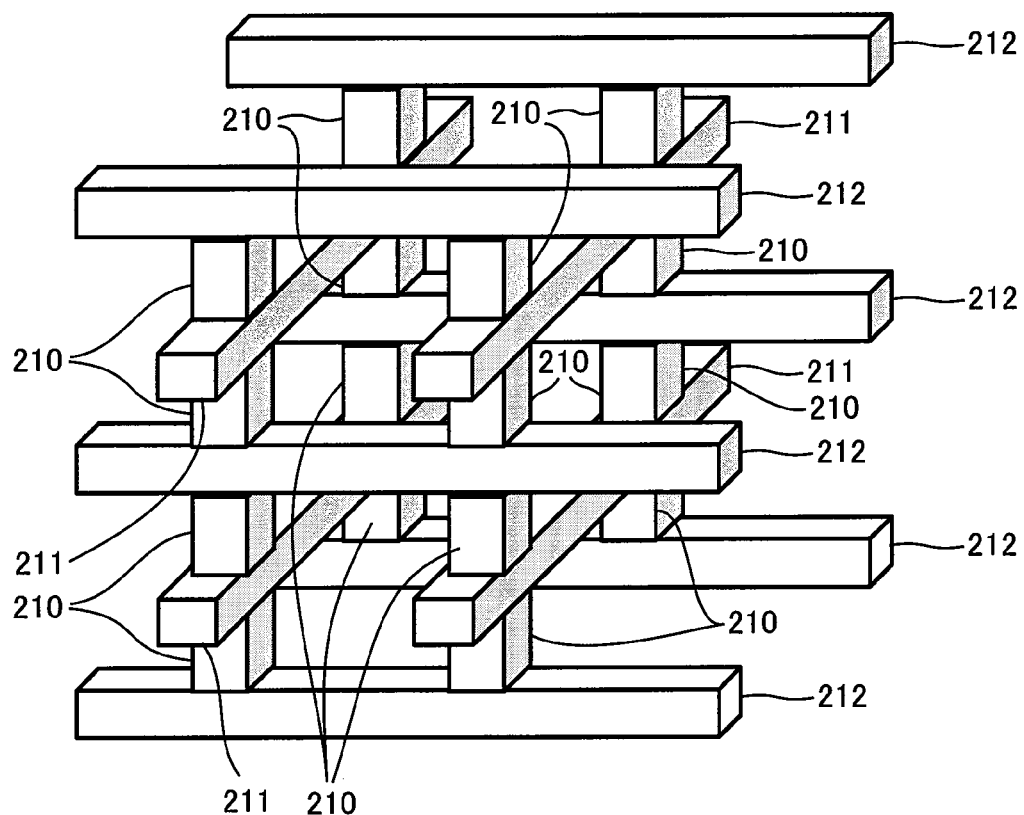
[FIG. 15]

FIG. 15 is a perspective view showing a configuration of a memory array included in the nonvolatile semiconductor device having the multi-layer structure of the present invention. As shown in FIG. 15, the nonvolatile semiconductor device includes a multi-layer memory array having plural layers of stacked memory arrays each including plural lower wires 212 formed on a semiconductor substrate (not shown) so as to extend in parallel with each other, plural upper wires 211 formed above the plural lower wires 212 so as to extend in parallel with each other within a plane parallel to a main surface of the semiconductor substrate and so as to three-dimensionally cross the plural lower wires 212, and plural memory cells 210 arranged in matrix so as to respectively correspond to three-dimensional cross points of the plural lower wires 212 and the plural upper wires 211.

In the example shown in FIG. 15, the wire layers are formed in five layers and the nonvolatile memory elements arranged at the three-dimensional cross points are formed in four layers. Alternatively, the number of these layers may be increased or decreased as desired.

By providing the multi-layer memory array configured as described above, a nonvolatile memory having a super-large capacity is attainable.

As already described in Embodiment 1, the resistance variable layer including hafnium oxide having a multi-layer structure of the present invention can be formed at a low temperature. Therefore, transistors or wire material such as silicide formed in a lower layer step are not affected even when a multi-layer structure is formed in a wiring step illustrated in this embodiment. As a result, a multi-layer memory array is easily attainable. That is, a nonvolatile semiconductor device having a multi-layer structure can be easily attained by using the resistance variable layer comprising the hafnium oxide having a multi-layer structure of the present invention.

[Example of Operation of Nonvolatile Semiconductor Device]

Subsequently, an example of the operation of the nonvolatile semiconductor device according to Embodiment 2 in a write cycle in which data is written and in a read cycle in which data is read, will be described with reference to a timing chart shown in FIG. 16.

Figure 16:
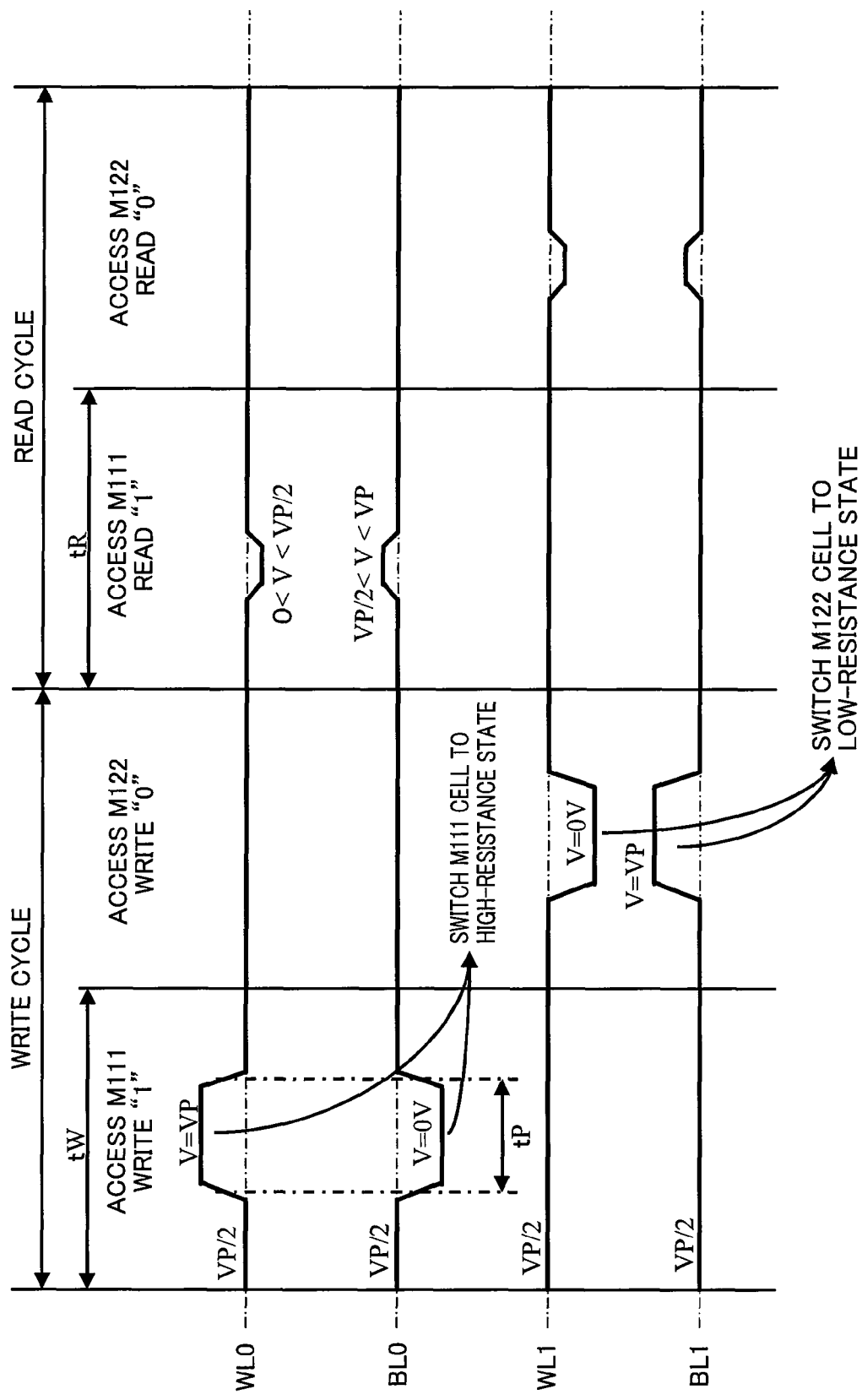
[FIG. 16]

FIG. 16 is a timing chart showing an example of the operation of the nonvolatile semiconductor device according to Embodiment 2 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading of data with respect to the memory cells M111 and M112 will be described.

VP in FIG. 16 denotes a pulse voltage required to enable the memory cell including the resistance variable element and the current rectifying element to switch its resistance. It is desired that a relationship $VP/2 < $ threshold voltage $Vf$ be established. This is because, this relationship can suppress a leak current flowing to unselected memory cells. This makes it possible to reduce an undesired current supplied to memory cells which do not require writing of data, thereby facilitating achievement of low electric power consumption. In addition, unintended insufficient writing (generally referred to as disturb) to the unselected memory cells is advantageously suppressed.

In FIG. 16, tW denotes a write cycle time which is a time required for one write cycle, and tR denotes a read cycle time which is a time required for one read cycle.

In a write cycle for the memory cell M111, a pulse voltage VP having a pulse width tP is applied to the word line WL0, and according to this timing, a voltage of 0V is applied to the bit line BL0 in the same manner. In this way, a write voltage for writing data "1" is applied to the memory cell M111, causing the resistance variable layer in the memory cell M111 to switch to the high-resistance state. That is, the data "1" is written to the memory cell M111.

Then, in a write cycle for the memory cell M122, a voltage of 0V and a pulse width tP is applied to the word line WL1, and according to this timing, the pulse voltage VP is applied to the bit line BL1 in the same manner. In this way, a write voltage for writing data "0" is applied to the memory cell M122, causing the resistance variable layer in the memory cell M122 to switch to the low-resistance state. That is, the data "0" is written to the memory cell M122.

In a read cycle for the memory cell M111, a pulse voltage which has a smaller amplitude than the pulse for writing and has a value larger than 0V and smaller than VP/2 is applied to the word line WL0. According to this timing, a pulse voltage which has a smaller amplitude than the pulse for writing and has a value larger than VP/2 and smaller than VP is applied to the bit line BL0. Thereby, a current corresponding to the resistance value of the resistance variable layer 214 in the memory cell M111 switched to the high-resistance state is output, and its output current value is detected, so that the data "1" is read.

Then, in a read cycle for the memory cell M122, a voltage identical to that in the previous read cycle for the memory cell M111 is applied to the word line WL1 and the bit line BL1. Thereby, a current corresponding to the resistance value of the resistance variable layer 214 in the memory cell M122 switched to the low-resistance state is output, and its output current value is detected, so that the data "0" is read.

In this embodiment, only the cross-point structure formed by integration on the semiconductor substrate is described. Alternatively, the cross-point structure may be formed on a more inexpensive substrate such as a plastic substrate, in place of the semiconductor substrate, and may be applied to a memory device which has a multi-layer structure formed by an assembling method using bumps or the like.

(Embodiment 3)

A nonvolatile semiconductor device according to Embodiment 3 is a nonvolatile semiconductor device which includes the nonvolatile memory element according to Embodiment 1, and is of a one transistor/one nonvolatile memory section type.

[Configuration of Nonvolatile Semiconductor Device According to Embodiment 3]

Figure 17:
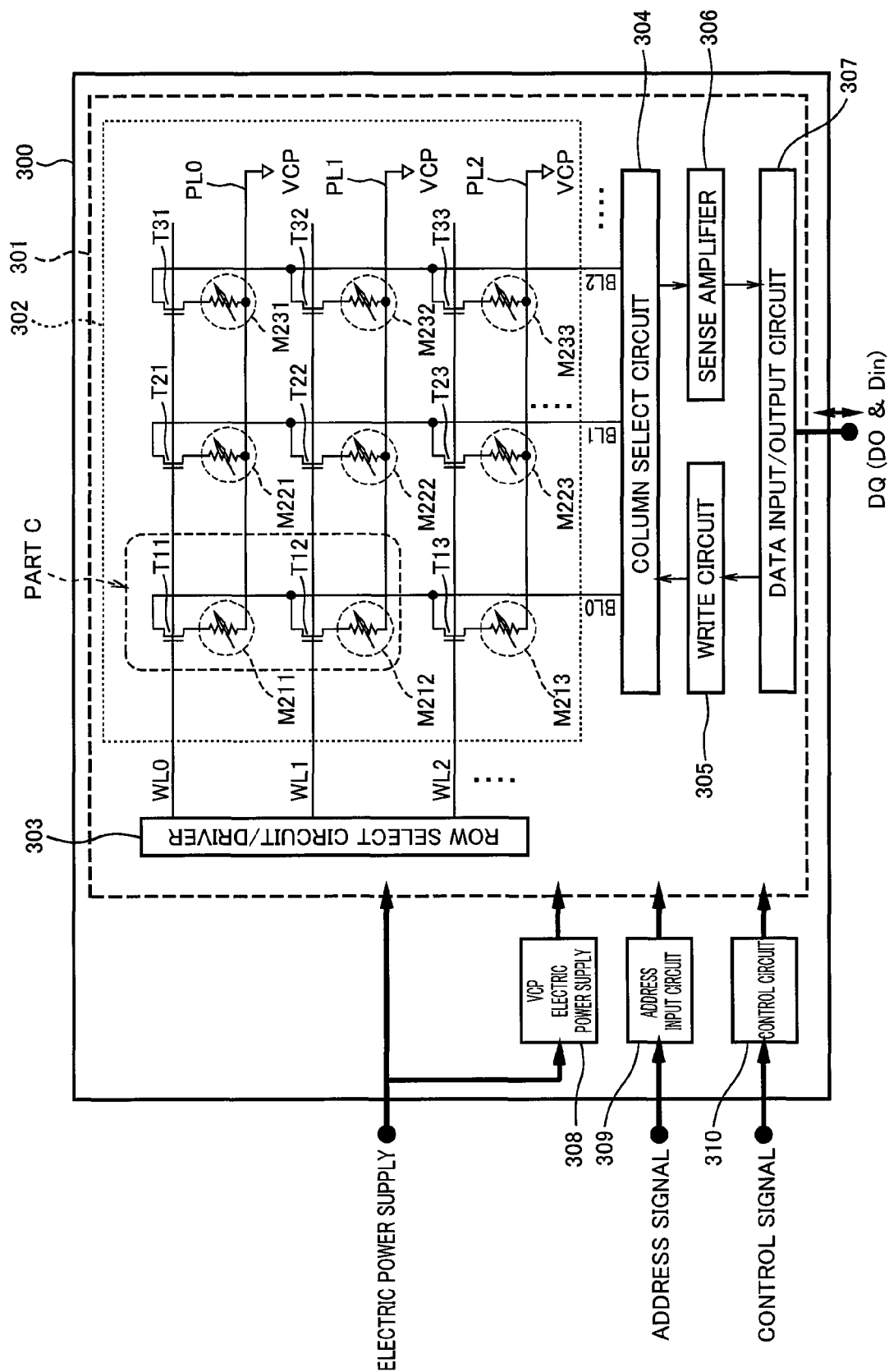
[FIG. 17]
Figure 18:
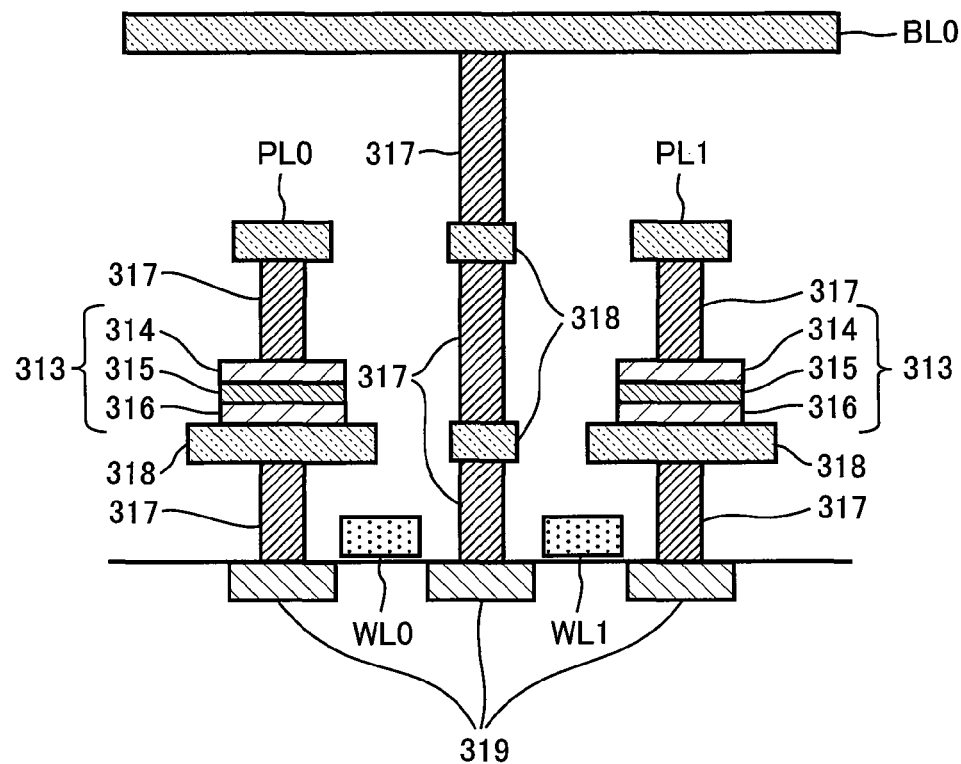
[FIG. 18]

FIG. 17 is a block diagram showing a configuration of a nonvolatile semiconductor device according to Embodiment 3 of the present invention. FIG. 18 is a cross-sectional view showing a configuration (configuration corresponding to 2 bits) in part C of FIG. 17.

As shown in FIG. 17, a nonvolatile semiconductor device 300 according to this embodiment includes a memory main section 301 on a semiconductor substrate. The memory main section 301 includes a memory array 302, a row select circuit/driver 303, a column select circuit 304, a write circuit 305 for writing data, a sense amplifier 306 which detects an amount of a current flowing in a selected bit line and determines the data as "1" or "0," and a data input/output circuit 307 which executes input/output processing of input and output data via the terminal DQ. The nonvolatile semiconductor device 300 further includes a cell plate electric power supply (VCP electric power supply) 308, an address input circuit 309 which receives an address signal externally input, and a control circuit 310 for controlling the operation of the memory main section 301, based on the control signal externally input.

The memory array 302 includes plural word lines WL0, WL1, WL2, . . . and plural bit lines BL0, BL1, BL2, . . . which are formed on the semiconductor substrate and are arranged to cross each other, plural transistors T11, T12, T13, T21, T22, T23, T31, T32, T33, . . . (hereinafter expressed as "transistors T11, T12, . . . ") provided to respectively correspond to cross-points of the word lines WL0, WL1, WL2, . . . and the bit lines BL0, BL1, BL2, . . . , and plural memory cells M211, M212, M213, M221, M222, M223, M231, M232, N233 (hereinafter expressed as "memory cells M211, M212, . . . " provided to respectively correspond to the transistors T11, T12, . . . such that one memory cell corresponds to one transistor.

The memory array 302 further includes plural plate lines PL0, PL1, PL2, . . . which are arranged to extend in parallel with the word lines WL0, WL1, WL2, . . . .

As shown in FIG. 18, the bit line BL0 is provided above the word lines WL0 and WL1, and the plate lines PL0 and PL1 are provided between the word lines WL0 and WL1 and the bit line BL0.

Each of the memory cells M211, M212, . . . corresponds to the nonvolatile memory element according to Embodiment 1, and includes a resistance variable layer comprising hafnium oxide having a multi-layer structure. To be specific, the nonvolatile memory element 313 in FIG. 18 corresponds to the memory cells M211, M212, . . . in FIG. 17, and is constituted by the upper electrode 314, the resistance variable layer 315 comprising hafnium oxide, and the lower electrode 316.

In FIG. 18, 317 denotes a plug layer, 318 denotes a metal wire layer, and 319 denotes source/drain regions.

As shown in FIG. 17, drains of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Sources of the transistors T11, T12, . . . are connected to the memory cells M211, M212, . . . , respectively.

The memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown), and outputs a row address signal and a column address signal to the row select circuit/driver 303 and to the column select circuit 304, respectively, based on the address signal. The address signal is a signal indicating the address of a specified memory cell to be selected from among the plural memory cells M211, M212, . . . . The row address signal is a signal indicating a row address in the address indicated by the address signal, and the column address signal is a signal indicating a column address in the address indicated by the address signal.

In a write cycle of data, the control circuit 310 outputs to the write circuit 305, a write signal for causing application of a write voltage, according to the input data Din input to the data input/output circuit 307. On the other hand, in a read cycle of data, the control circuit 310 outputs to the column select circuit 304, a read signal for causing application of a read voltage.

The row select circuit/driver 303 receives the row address signal output from the address input circuit 309, selects one from among the plural word lines WL0, WL1, WL2, . . . according to the row address signal, and applies a predetermined voltage to the selected word line.

The column select circuit 304 receives a column address signal output from the address input circuit 309, selects one from among the plural bit lines BL0, BL1, BL2, . . . according to the column address signal, and applies the write voltage or the read voltage to the selected bit line.

Receiving the write signal output from the control circuit 310, the write circuit 305 outputs to the column select circuit 304, a signal for causing application of the write voltage to the selected bit line.

In the read cycle of data, the sense amplifier 306 detects an amount of a current flowing in the selected bit line which is a read target, and determines the data as "1" or "0." The resulting output data DO is output to the external circuit via the data input/output circuit 307.

In Embodiment 3 using the configuration of one transistor/one nonvolatile memory section, a storage capacity is smaller than that of the configuration using the cross-point configuration in Embodiment 2. However, since Embodiment 3 may dispense with the current rectifying element such as the diode, Embodiment 3 has an advantage that it is easily combined with the CMOS process, and operation control therefor is easy.

As in Embodiment 2, the resistance variable layer of the present invention can be formed at a low temperature. Therefore, it is advantageous that transistors and wire material such as silicide formed in a lower layer step are not affected even when a multi-layer structure is formed in a wiring step as illustrated in this embodiment.

Furthermore, as in Embodiment 2, since the layer deposition of hafnium and hafnium oxide is easily incorporated into the existing semiconductor manufacturing process, the nonvolatile semiconductor device of this embodiment can be easily manufactured.

[Example of Operation of Nonvolatile Semiconductor Device]

Subsequently, an example of the operation of the nonvolatile semiconductor device according to Embodiment 3 in a write cycle in which data is written and in a read cycle in which data is read, will be described with reference to a timing chart shown in FIG. 19.

Figure 19:
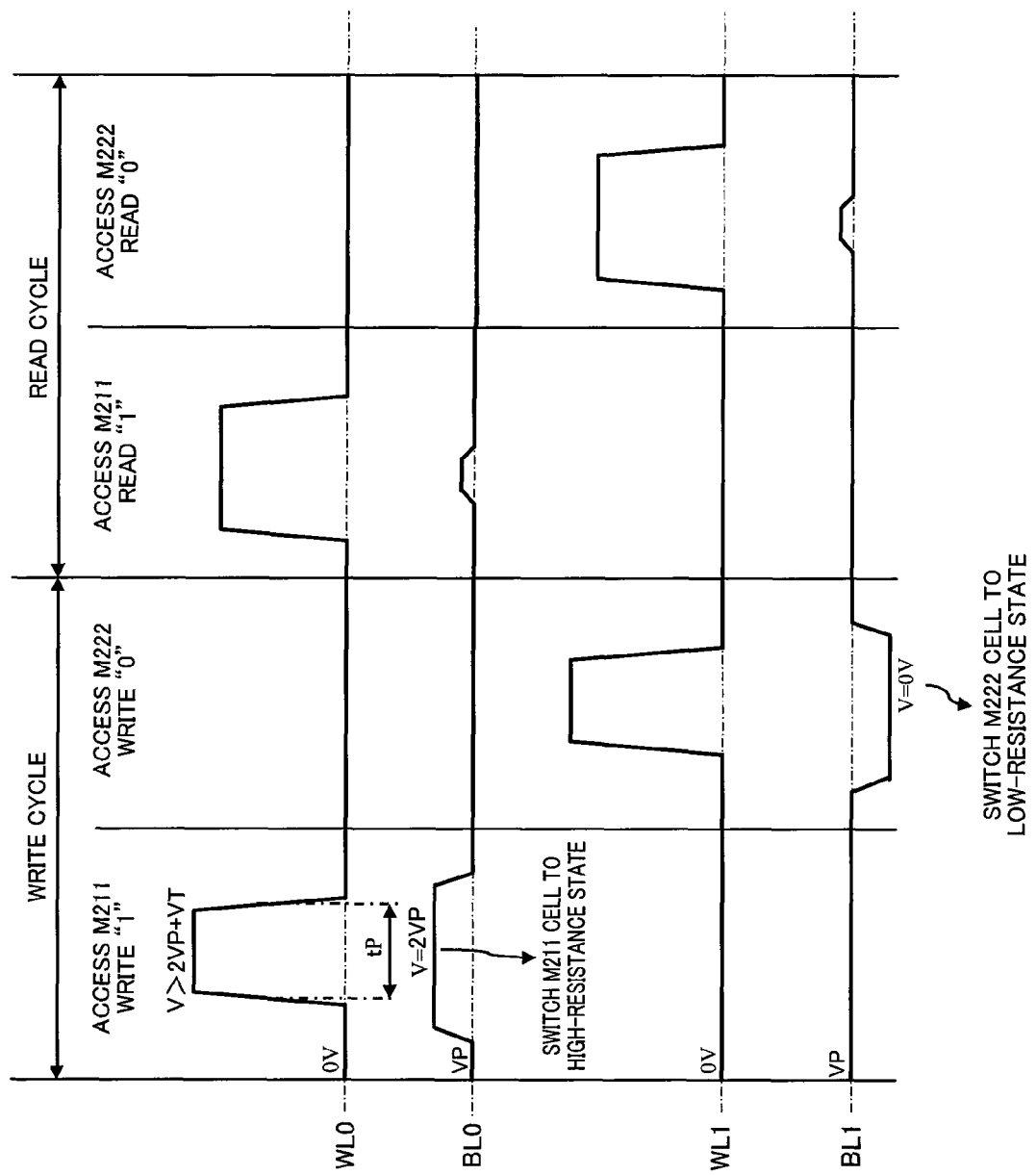
[FIG. 19]

FIG. 19 is a timing chart showing an example of the operation of the nonvolatile semiconductor device according to Embodiment 3 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading of data with respect to the memory cells M211 and M222 are shown.

In FIG. 19, VP denotes a pulse voltage required to enable the resistance variable element to switch its resistance, and VT denotes a threshold voltage of the transistor. The voltage VP is always applied to the plate line, and the bit line is precharged with a voltage VP when it is unselected.

In a write cycle for the memory cell M211, a voltage which is higher than a pulse voltage 2VP+transistor threshold voltage VT and has a pulse width tP is applied to the word line WL0, causing the transistor T11 to be tuned on. According to this timing, a pulse voltage 2VP is applied to the bit line BL0. In this way, a write voltage for writing data "1" is applied to the memory cell M211, causing the resistance variable layer in the memory cell M211 to switch to the high-resistance state. That is, the data "1" is written to the memory cell M211.

Then, in a write cycle for the memory cell M222, a voltage which is higher than a pulse voltage 2VP+transistor threshold voltage VT and has a pulse width tP is applied to the word line WL1, causing the transistor T22 to be tuned on. According to this timing, a voltage of 0V is applied to the bit line BL1. In this way, a write voltage for writing data "0" is applied to the memory cell M222, causing the resistance variable layer in the memory cell M222 to switch to the low-resistance state. That is, the data "0" is written to the memory cell M222.

In a read cycle for the memory cell M211, a predetermined voltage for turning on the transistor T11 is applied to the word line WL0, and according to this timing, a pulse voltage having a smaller amplitude than the pulse width for writing is applied to the bit line BL0. Thereby, a current corresponding to the resistance value of the resistance variable layer of the memory cell M211 switched to the high-resistance state is output, and its output current value is detected, so that the data "1" is read.

In a read cycle for the memory cell M222, a voltage identical to that in the previous read cycle for the memory cell M211 is applied to the word line WL1 and to the bit line BL1. Thereby, a current corresponding to the resistance value of the resistance variable layer of the memory cell M222 switched to the low-resistance state is output, and its output current value is detected, so that the data "0" is read.

As already described in Embodiment 2, in this embodiment, memory cells for redundancy and memory cells for parity bits for error correction may be provided separately. In that case, as these memory cells, the nonvolatile memory elements of the present invention may be used.

(Embodiment 4)

A nonvolatile semiconductor device according to Embodiment 4 is a nonvolatile semiconductor device which includes at least one of the nonvolatile memory elements according to Embodiment 1 having a programming function and a logic circuit for executing predetermined calculation.

[Configuration of Nonvolatile Semiconductor Device]

Figure 20:
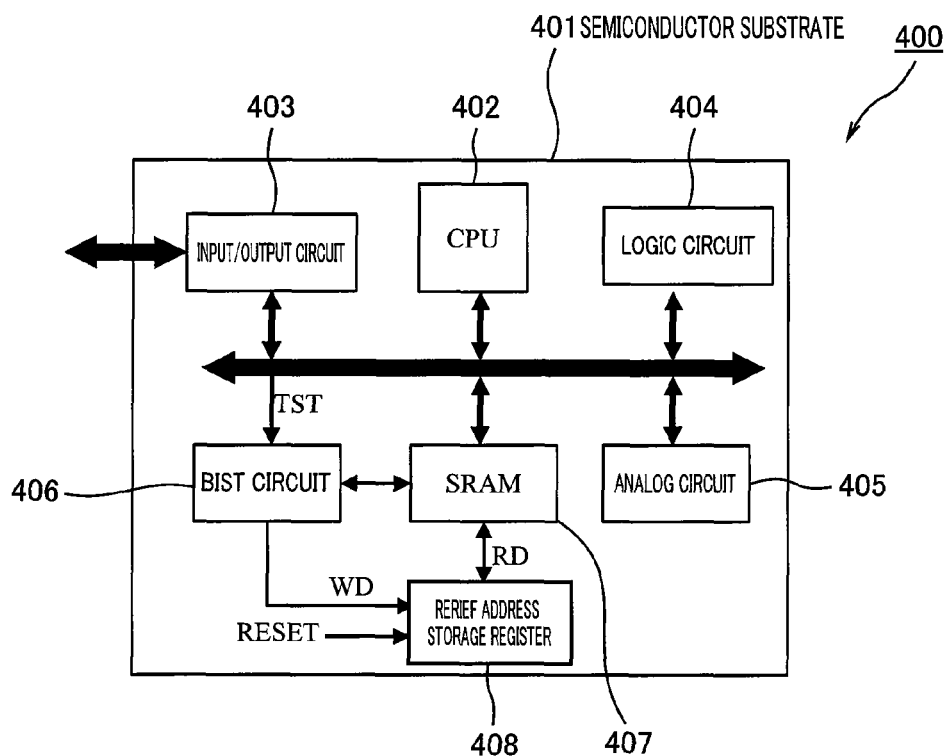
[FIG. 20]

FIG. 20 is a block diagram showing a configuration of a nonvolatile semiconductor device according to Embodiment 4 of the present invention.

As shown in FIG. 20, a nonvolatile semiconductor device 400 according to this embodiment includes, on a semiconductor substrate 401, a CPU 402, an input/output circuit 403 for inputting/outputting data to/from an external circuit, a logic circuit 404 for executing predetermined calculation, an analog circuit 405 for processing an analog signal, a BIST (Built In Self Test) circuit 406 for performing self diagnosis, a SRAM 407, and a relief address storage register 408 which is connected to the BIST circuit 406 and to the SRAM 407 and serves to store specific address data.

Figure 21:
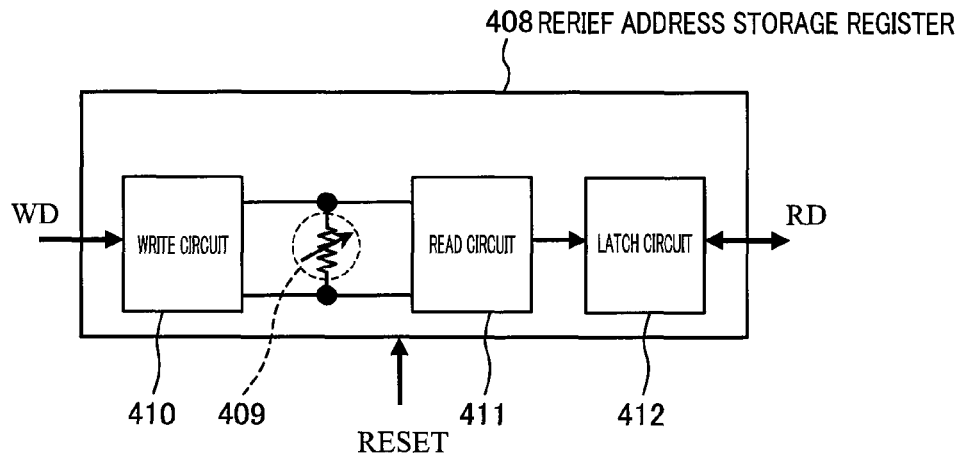
[FIG. 21]
Figure 22:
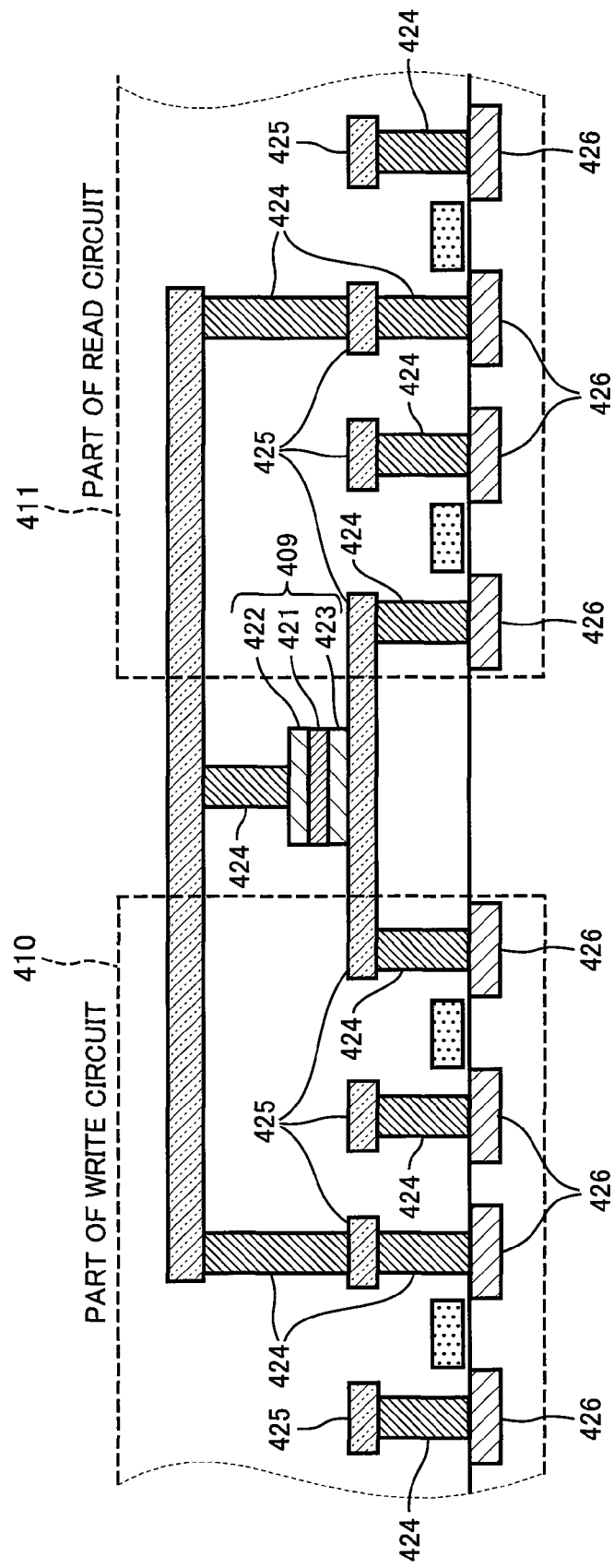
[FIG. 22]

FIG. 21 is a block diagram showing a configuration of a relief address storage register included in the nonvolatile semiconductor device according to Embodiment 4 of the present invention. FIG. 22 is a cross-sectional view showing a configuration of the relief address storage register.

As shown in FIGS. 21 and 22, the relief address storage register 408 includes a nonvolatile memory element 409 corresponding to the nonvolatile memory element according to Embodiment 1, a write circuit 410 for writing specific address data to the nonvolatile memory element 409, a read circuit 411 for reading the address data written in the nonvolatile memory element 409, and a latch circuit 412.

The nonvolatile memory element 409 is connected to a switch section to the write circuit 410 side and a switch section to the read circuit 411 side, and has a structure in which a resistance variable layer 421 is sandwiched between an upper electrode 422 and a lower electrode 423. The nonvolatile memory element 409 corresponds to the nonvolatile memory element according to Embodiment 1.

In FIG. 22, 424 denotes a plug layer, 425 denotes a metal wire layer, and 426 denotes a source/drain layer.

Whereas in this embodiment, two-layer wires are provided and the nonvolatile memory element is provided between the first wire and the second wire, multi-layer wires of three or more layers may alternately be provided and the nonvolatile memory element may be disposed between desired wires, for example. In further alterative, the nonvolatile memory element may be disposed between plural wires as desired.

[Example of Operation of Nonvolatile Semiconductor Device]

Subsequently, an example of the operation of the nonvolatile semiconductor device according to this embodiment configured as described above will be described.

Hereinafter, a case where the address data is written to the relief address storage register 408 will be described. The BIST circuit 406 inspects a memory block in the SRAM 407, upon reception of a diagnosis command signal TST.

The memory block is inspected during inspection in a manufacturing process of LSI, and during various diagnostic processes carried out in the case where the LSI is mounted to an actual system.

If a faulty bit is detected as a result of inspection of the memory block, the BIST circuit 406 outputs write data command signal WD to the relief address storage register 408. Receiving the write data command signal WD, the relief address storage register 408 stores therein address data corresponding to the faulty bit.

The address data is stored by switching the resistance state of the resistance variable layer in the associated register to the high-resistance state or to the low-resistance state, according to the address data. The switching of the resistance variable layer to the high-resistance state or to the low-resistance state is implemented as in Embodiment 1.

In this way, the address data is written to the relief address storage register 408. When the SRAM 407 is accessed, the address data written in the relief address storage register 408 is read simultaneously. The address data is read by detecting an output current value corresponding to the resistance state of the resistance variable layer as in Embodiment 1.

When the address data read from the relief address storage register 408 matches the address data of an access target, backup memory cells for redundancy provided within the SRAM 407 are accessed, so that data is read or written.

The self diagnosis performed as described above eliminates a need for an expensive LSI tester provided externally, in inspection in the manufacturing process. In addition, Embodiment 4 has an advantage that "at-Speed test" can be conducted. Furthermore, Embodiment 4 has an advantage that since faulty bits due to deterioration with a time can be relieved as well as faulty bits in the inspection, a high quality can be maintained for a long period of time.

The nonvolatile semiconductor device according to this embodiment is applicable to a case where data is written only once in the manufacturing process and to a case where data is rewritten repeatedly after shipment of products.

[Method of Manufacturing Nonvolatile Semiconductor Device]

Subsequently, a manufacturing method of the nonvolatile semiconductor device according to this embodiment as configured described above will be described.

Figure 23:
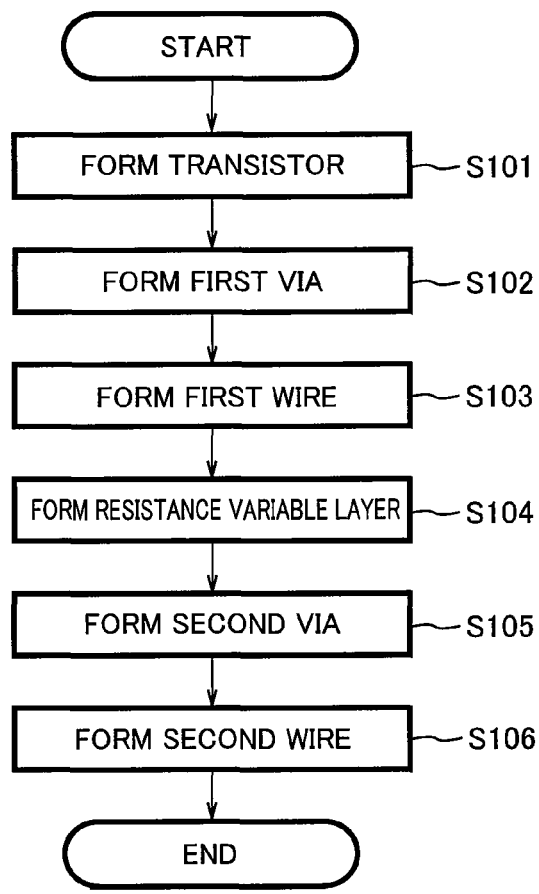
[FIG. 23]
Figure 24:
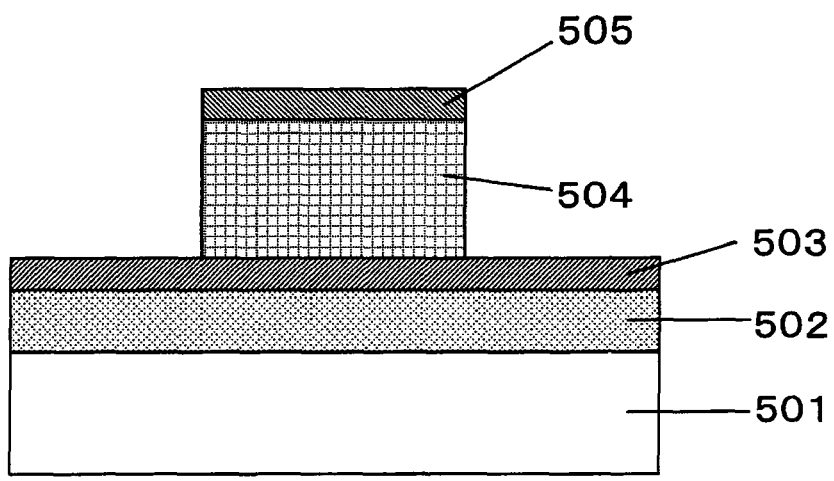
[FIG. 24]

FIG. 23 is a flowchart showing a main flow of a manufacturing process of the nonvolatile semiconductor device according to Embodiment 4 of the present invention.

Initially, a transistor is formed on the semiconductor substrate (S101). Then, a first via is formed (S102), and a first wire is formed thereon (S103).

Then, the resistance variable layer is formed on the first wire formed in S103 (S104). The resistance variable layer is formed in a manner described in Embodiment 1.

Then, a second via is formed on the resistance variable layer (S105), and further, a second wire is formed thereon (S106).

As described above, the manufacturing method of the nonvolatile semiconductor device of this embodiment is such that the step of forming the electrodes and the resistance variable layer is added to the manufacturing step of the COMS process. Therefore, the nonvolatile semiconductor device can be easily manufactured by utilizing the existing CMOS process. In addition, since additional steps are fewer and the thickness of the resistance variable layer is relatively small, the time of the process can be shortened.

As in Embodiment 1, the resistance variable layer of the present invention can be formed at a low temperature. Therefore, it is advantageous that transistors and wire material such as silicide formed in a lower layer step are not affected even when a multi-layer structure is formed in a wiring step illustrated in this embodiment.

Since the electrode portion can be formed with 1 μm square or smaller and other circuits can be formed using the CMOS process, a small-sized nonvolatile switch circuit is easily attainable.

Instead of using the nonvolatile memory element including the resistance variable layer including hafnium oxide having a multi-layer structure in Embodiment 1 like this embodiment, it may be expected that the nonvolatile semiconductor device is implemented by using a known flash memory nonvolatile memory element or a known FeRAM memory nonvolatile memory element. In those cases, however, a special process step and materials become necessary, which makes it difficult that these nonvolatile memory elements are compatible with the COMS process. For this reason, a cost problem arises, and the manufacturing steps significantly increases, which is not practical. Further, a problem arises, that these nonvolatile memory elements are difficult to use as the programming element, because write and read of data in these memory elements is complicated.

As a configuration which is highly compatible with the CMOS process, there is provided a memory cell called a CMOS nonvolatile memory cell, which operates equivalently to the flash memory cell by floating the gate wires in the COMS process. However, such a configuration causes problems that area of the element section increases and control of its operation is complicated.

The configuration using an electric fuse element such as a silicide fuse element may be highly compatible with the CMOS process. In this case, however, problems that rewrite of the data cannot be performed, and the area of the element section increases arise.

The wires may be trimmed by a known laser. In this case, however, problems will arise, in which such a method is limited only in a manufacturing process, miniaturization is limited by a mechanical precision of a laser trimmer, or there is a limitation on layout, because the wires must be positioned as an uppermost layer.

Whereas the nonvolatile memory element in Embodiment 1 is used as the relief address storage register of the SRAM in this embodiment, the following examples may alternatively be used. For example, the nonvolatile memory element in Embodiment 1 may be used as the relief address storage register for faulty bits in DRAM, ROM, or the nonvolatile semiconductor devices according to Embodiment 2 and Embodiment 3.

The nonvolatile memory element may be applied to a nonvolatile switch for switching a faulty logic circuit or a backup logic circuit. Furthermore, the nonvolatile memory element may be used as a register for adjusting a voltage in an analog circuit and for adjusting timing in the analog circuit, a register for modifying a ROM of post-manufacture, a nonvolatile switch element for reconfigurable logic and FPGA, and a nonvolatile register.

(Other Embodiment)

The nonvolatile semiconductor device according to Embodiment 4 may be configured to include the nonvolatile semiconductor device according to Embodiment 2, that is, to integrate on a single semiconductor substrate the cross-point nonvolatile semiconductor device according to Embodiment 2 and the LSI having the CPU or the like according to Embodiment 4.

In this case, the cross-point nonvolatile semiconductor device according to Embodiment 2 and the LSI having the CPU or the like according to Embodiment 4 may be formed on different semiconductor substrates, and thereafter may be molded into one package.

The nonvolatile semiconductor device according to Embodiment 4 may be configured to include the nonvolatile semiconductor device according to Embodiment 3, that is, to integrate on one semiconductor substrate the nonvolatile semiconductor device having the one transistor/one nonvolatile memory section configuration according to Embodiment 3 and the LSI having the CPU or the like according to Embodiment 4.

In this case, also, the nonvolatile semiconductor memory device having the one transistor/one nonvolatile memory section configuration according to Embodiment 3 and the LSI having the CPU or the like according to Embodiment 4 may be formed on different semiconductor substrates, and thereafter may be molded into one package.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A nonvolatile memory element and nonvolatile semiconductor device of the present invention are capable of a high-speed operation, have a stable rewrite characteristic, and are useful as a nonvolatile memory element or the like used in various electronic hardware such as digital home appliance, memory cards, cellular phones, and personal computers.

EXPLANATION OF REFERENCE NUMERALS 100, 100A, 100B, 100C, 100D, 100E, 100F nonvolatile memory elements
101 substrate
102 oxide layer
103, 103A, 103B, 103C, 103D, 103E, 103F first electrode layers
104 first hafnium oxide layer
105 second hafnium oxide layer
106 third hafnium oxide layer
104A, 106B, 106C high-oxygen-concentration hafnium oxide layers
105A, 105B, 105C hafnium oxide layers
107, 107A, 107B, 107C, 107D, 107E, 107F resistance variable layers
108, 108A, 108B, 108C, 108D, 108E, 108F second electrode layers
109 element region
200 nonvolatile semiconductor device
201 memory main section
202 memory array
203 row select circuit/driver
204 column select circuit/driver
205 write circuit
206 sense amplifier
207 data input/output circuit
208 address input circuit
209 control circuit
210 nonvolatile memory element
211 upper wire
212 lower wire
213 upper electrode
214 resistance variable layer
215 inner electrode
216 current rectifying element
217 lower electrode
218 ohmic resistance layer
219 second resistance variable layer
300 nonvolatile semiconductor device
301 memory main section
302 memory array
303 row select circuit/driver
304 column select circuit
305 write circuit
306 sense amplifier
307 data/input circuit
308 cell plate electric power supply
309 address input circuit
310 control circuit
313 nonvolatile memory element
314 upper electrode
315 resistance variable layer
316 lower electrode
317 plug layer
318 metal wire layer
319 source/drain region
400 nonvolatile semiconductor device
401 semiconductor substrate
402 CPU
403 input/output circuit
404 logic circuit
405 analog circuit
406 BIST circuit
407 SRAM
408 relief address storage register
409 nonvolatile memory element
410 write circuit
411 read circuit
412 latch circuit
421 resistance variable layer 422 upper electrode
423 lower electrode
424 plug layer
425 metal wire layer
426 source/drain layer
501 substrate
502 oxide layer
503 lower electrode
504 resistance variable layer
505 upper electrode
BL0, BL1, . . . bit lines
M111, M112, . . . , M211, M212, . . . memory cells
T11, T12, . . . transistors
WL0, WL1, . . . word lines
PL0, PL1, PL2, . . . plate lines
1300 element F
1300~1304 electrodes
1305 oxygen-deficient tantalum oxide layer

The invention claimed is:

1. A nonvolatile memory element comprising:
a first electrode;
a second electrode; and
a resistance variable layer which is interposed between the first electrode and the second electrode and is configured to switch a resistance value reversibly in response to electric signals applied between the electrodes; the nonvolatile memory element being configured to reversibly switch a resistance value between the first electrode and the second electrode in response to electric signals of different polarities which are applied between the first electrode and the second electrode;
wherein the resistance variable layer has a multi-layer structure in which a second oxygen-deficient hafnium oxide layer being electrically conductive and having a composition expressed as $HfO_x$ ($0.9 \leq x \leq 1.6$), and a first oxygen-deficient hafnium oxide layer being electrically conductive and having a composition expressed as $HfO_y$ ($1.8 < y < 2.0$) are stacked together.

2. The nonvolatile memory element according to claim 1, wherein the first oxygen-deficient hafnium oxide layer has a thickness which is not less than 3 nm and not more than 4 nm.

3. The nonvolatile memory element according to claim 1, wherein the first oxygen-deficient hafnium oxide layer is in contact with one of the first electrode and the second electrode.

4. The nonvolatile memory element according to claim 3, wherein when a resistance value between the first electrode and the second electrode which occurs by applying a positive electric pulse with a magnitude of $V_H$ to an electrode with which the first oxygen-deficient hafnium oxide layer is in contact is expressed as $R_H$, and a resistance value between the first electrode and the second electrode which occurs by applying a negative electric pulse with a magnitude of $V_L$ to the electrode with which the first oxygen-deficient hafnium oxide layer is in contact is expressed as $R_L$, $|V_H|>|V_L|$, and $R_H>R_L$ are satisfied.

5. The nonvolatile memory element according to claim 1, wherein the nonvolatile memory element includes a current rectifying element provided between the first electrode and the second electrode; and
wherein the current rectifying element is electrically connected to the resistance variable layer.

6. A nonvolatile semiconductor device comprising:
a semiconductor substrate; and
a memory array including plural first electrode wires provided on the semiconductor substrate so as to extend in parallel with each other, plural second electrode wires provided above the plural first electrode wires so as to extend in parallel with each other within a plane parallel to a main surface of the semiconductor substrate and so as to three-dimensionally cross the plural first electrode wires, respectively, and nonvolatile memory elements which are arranged at three-dimensional cross points of the plural first electrode wires and the plural second electrode wires;
wherein when each of the first electrode wires is a first electrode and each of the second electrode wires is a second electrode, each of the nonvolatile memory elements includes a resistance variable layer which is interposed between the first electrode and the second electrode and is configured to switch a resistance value reversibly in response to electric signals of different polarities which are applied between the first electrode and the second electrode; and
wherein the resistance variable layer has a multi-layer structure in which a second hafnium oxide layer having a composition expressed as $HfO_x$ ($0.9 \leq x \leq 1.6$), and a first hafnium oxide layer having a composition expressed as $HfO_y$ ($1.8 < y < 2.0$) are stacked together.

7. The nonvolatile semiconductor device according to claim 6,
wherein the first oxygen-deficient hafnium oxide layer has a thickness which is not less than 3 nm and not more than 4 nm.

8. The nonvolatile semiconductor device according to claim 6,
wherein the first oxygen-deficient hafnium oxide layer is in contact with one of the first electrode and the second electrode.

9. The nonvolatile semiconductor device according to claim 6,
wherein the nonvolatile memory element includes a current rectifying element provided between the first electrode and the second electrode; and
wherein the current rectifying element is electrically connected to the resistance variable layer.

10. A nonvolatile semiconductor device comprising a multi-layer memory array in which plural layers of the memory array included in the nonvolatile semiconductor device according to claim 6 are stacked together.

11. A nonvolatile semiconductor device comprising:
a semiconductor substrate; and
a memory array including plural first electrode wires provided on the semiconductor substrate so as to extend in parallel with each other, plural second electrode wires provided above the plural first electrode wires so as to extend in parallel with each other within a plane parallel to a main surface of the semiconductor substrate and so as to three-dimensionally cross the plural first electrode wires, respectively, and nonvolatile memory elements which are arranged so as to respectively correspond to three-dimensional cross points of the plural first electrode wires and the plural second electrode wires;
wherein each of the nonvolatile memory elements includes a first electrode connected to the first electrode wire; a second electrode connected to the second electrode wire; and a resistance variable layer which is interposed between the first electrode and the second electrode and is configured to switch a resistance value reversibly in response to electric signals of different polarities which are applied between the first electrode and the second electrode; and wherein the resistance variable layer has a multi-layer structure in which a second hafnium oxide layer having a composition expressed as $HfO_x$ ($0.9 \leq x \leq 1.6$), and a first hafnium oxide layer having a composition expressed as $HfO_y$ ($1.8 < y < 2.0$) are stacked together.

12. The nonvolatile semiconductor device according to claim 11, wherein the first hafnium-containing layer has a thickness which is not less than 3 nm and not more than 4 nm.

13. The nonvolatile semiconductor device according to claim 11, wherein the first oxygen-deficient hafnium oxide layer is in contact with one of the first electrode and the second electrode.

14. The nonvolatile semiconductor device according to claim 11, wherein each of the nonvolatile memory elements includes a current rectifying element provided between the first electrode and the second electrode; and wherein the current rectifying element is electrically connected to the resistance variable layer.

15. A nonvolatile semiconductor device comprising a multi-layer memory array in which plural layers of the memory array included in the nonvolatile semiconductor device according to claim 11 are stacked together.

16. A nonvolatile semiconductor device comprising:

a semiconductor substrate;

plural word lines and plural bit lines which are provided on the semiconductor substrate and are arranged so as to respectively cross each other;

plural transistors which are provided so as to respectively correspond to cross points of the plural word lines and the plural bit lines; and plural nonvolatile memory elements which are provided so as to respectively correspond to the plural transistors;

wherein each of the nonvolatile memory elements includes a first electrode; a second electrode; and a resistance variable layer which is interposed between the first electrode and the second electrode and is configured to switch a resistance value reversibly in response to electric signals of different polarities which are applied between the first electrode and the second electrode via a source electrode or a drain electrode of associated one of the transistors; and wherein the resistance variable layer has a multi-layer structure in which a second hafnium oxide layer having a composition expressed as $HfO_x$ ($0.9 \leq x \leq 1.6$), and a first hafnium oxide layer having a composition expressed as $HfO_y$ ($1.8 < y < 2.0$) are stacked together.

17. The nonvolatile semiconductor device according to claim 16, wherein the first hafnium oxide layer has a thickness which is not less than 3 nm and not more than 4 nm.

18. The nonvolatile semiconductor device according to claim 16, wherein the first oxygen-deficient hafnium oxide layer is in contact with one of the first electrode and the second electrode.

19. A nonvolatile semiconductor device comprising:

a semiconductor substrate;

a logic circuit which is provided on the semiconductor substrate and is configured to perform predetermined calculation; and the nonvolatile memory element according to claim 1, which is provided on the semiconductor substrate;

wherein the nonvolatile memory element according to claim 1 has a programming function.

20. The nonvolatile memory device according to claim 6, comprising:

a logic circuit which is provided on the semiconductor substrate and is configured to perform predetermined calculation;

wherein the nonvolatile memory element has a programming function.

21. A method of manufacturing a nonvolatile memory element including a first electrode; a second electrode; and a resistance variable layer which is interposed between the first electrode and the second electrode and is configured to switch a resistance value reversibly in response to electric signals of different polarities which are applied between the first electrode and the second electrode;

wherein the resistance variable layer has a multi-layer structure in which a second hafnium oxide layer having a composition expressed as $HfO_x$ ($0.9 \leq x \leq 1.6$), and a first hafnium oxide layer having a composition expressed as $HfO_y$ ($1.8 < y < 2.0$) are stacked together, the method comprising:

forming the second hafnium oxide layer by a sputtering process or a chemical vapor deposition process.

22. The method of manufacturing the nonvolatile memory element according to claim 21, comprising:

forming the first hafnium oxide layer by a sputtering process or a chemical vapor deposition process.

23. The method of manufacturing the nonvolatile memory element according to claim 21, comprising:

forming the first hafnium oxide layer by partially oxidating the second hafnium oxide layer.

24. The method of manufacturing the nonvolatile memory element according to claim 21, wherein the first hafnium oxide layer is formed to have a thickness which is not less than 3 nm and not more than 4 nm.

25. The method of manufacturing the nonvolatile memory element according to claim 21, wherein the first oxygen-deficient hafnium oxide layer is in contact with one of the first electrode and the second electrode.

* * * * *